US009954698B1

(12) United States Patent
Huang et al.

(10) Patent No.: US 9,954,698 B1
(45) Date of Patent: Apr. 24, 2018

(54) EFFICIENT RESOURCE SHARING IN A DATA STREAM PROCESSING DEVICE

(71) Applicant: Hughes Network Systems, LLC, Germantown, MD (US)

(72) Inventors: Tony Chu Huang, Germantown, MD (US); Ninad Kelkar, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 15/374,541

(22) Filed: Dec. 9, 2016

(51) Int. Cl.
| | |
|---|---|
| *H03H 11/26* | (2006.01) |
| *H03H 17/00* | (2006.01) |
| *G06F 5/06* | (2006.01) |
| *H04L 25/03* | (2006.01) |

(52) U.S. Cl.
CPC .......... *H04L 25/03025* (2013.01); *G06F 5/06* (2013.01); *H03H 11/26* (2013.01); *H03H 17/0009* (2013.01); *H04L 2025/03484* (2013.01)

(58) Field of Classification Search
CPC .............. H03H 17/0009; H03H 11/26; H04L 25/03025; H04L 2025/03484; G06F 5/06
See application file for complete search history.

(56) References Cited

U.S. PATENT DOCUMENTS

| | | | | |
|---|---|---|---|---|
| 5,995,988 A | * | 11/1999 | Freidin | H03K 19/1736 708/232 |
| 7,483,420 B1 | * | 1/2009 | Esposito | G11C 19/00 370/291 |
| 8,289,195 B1 | * | 10/2012 | Dong | H03H 17/0292 327/156 |
| 2011/0134335 A1 | * | 6/2011 | Laurent-Michel | H04B 1/001 348/731 |

* cited by examiner

*Primary Examiner* — David B. Lugo
(74) *Attorney, Agent, or Firm* — NovoTechIP International PLLC

(57) ABSTRACT

A data stream processing device including a first tapped delay line which outputs data values received via a first data input on N first taps, wherein N is two or more; a second tapped data delay line which outputs data values received via a second data input on N second taps; a first processing unit including N first delayed data inputs and which generates a first data output based on the N first delayed data inputs; a second processing unit including N second delayed data inputs and which generates a second data output based on the N second delayed data inputs; and control circuitry including a mode selection input, and which is coupled to in response to the mode selection input receiving a signal indicating a first mode, simultaneously couple each of the first taps to a respective one of the first delayed data inputs and couple each of the second taps to a respective one of the second delayed data inputs, and in response to the mode select input not receiving a signal indicating the first mode, simultaneously couple one of the first taps to one of the second delayed data inputs and couple one of the second taps to one of the first data inputs.

18 Claims, 17 Drawing Sheets

FIG.8C

|  |  | COLUMN 1 | COLUMN 2 | COLUMN 3 | COLUMN 4 | COLUMN 5 | COLUMN 6 |
|---|---|---|---|---|---|---|---|
| ROW 1 | M=1 | OUT 1,1 | OUT 1,2 | OUT 1,3 | OUT 1,4 | OUT 1,5 | OUT 1,6 |
|  | M=2 | OUT 2,1 | OUT 2,1 | OUT 1,2 | OUT 2,2 | OUT 1,3 | OUT 2,3 |
|  | M=3 | OUT 1,1 | OUT 1,2 | OUT 1,3 | OUT 1,4 | OUT 1,5 | OUT 1,6 |
|  | M=4 | OUT 1,1 | OUT 3,1 | OUT 1,2 | OUT 3,2 | OUT 1,3 | OUT 3,3 |
|  | M=5 | OUT 1,1 | OUT 2,1 | OUT 3,1 | OUT 1,2 | OUT 2,2 | OUT 3,2 |
|  |  | MUX 1,1 | MUX 1,2 | MUX 1,3 | MUX 1,4 | MUX 1,5 | MUX 1,6 |
| ROW 2 | M=1 | OUT 2,1 | OUT 2,2 | OUT 2,3 | OUT 2,4 | OUT 2,5 | OUT 2,6 |
|  | M=2 | OUT 2,1 | OUT 1,2 | OUT 2,2 | OUT 1,3 | OUT 2,3 | OUT 1,4 |
|  | M=3 | OUT 2,1 | OUT 3,1 | OUT 2,3 | OUT 3,2 | OUT 2,3 | OUT 3,3 |
|  | M=4 | OUT 2,1 | OUT 2,2 | OUT 2,3 | OUT 2,4 | OUT 2,5 | OUT 2,6 |
|  | M=5 | OUT 2,1 | OUT 3,1 | OUT 1,2 | OUT 2,2 | OUT 3,2 | OUT 1,3 |
|  |  | MUX 2,1 | MUX 2,2 | MUX 2,3 | MUX 2,4 | MUX 2,5 | MUX 2,6 |
| ROW 3 | M=1 | OUT 3,1 | OUT 3,2 | OUT 3,3 | OUT 3,4 | OUT 3,5 | OUT 3,6 |
|  | M=2 | OUT 3,1 | OUT 3,2 | OUT 3,3 | OUT 3,4 | OUT 3,5 | OUT 3,6 |
|  | M=3 | OUT 3,1 | OUT 2,2 | OUT 3,2 | OUT 2,3 | OUT 3,3 | OUT 2,4 |
|  | M=4 | OUT 3,1 | OUT 1,2 | OUT 3,2 | OUT 1,3 | OUT 3,3 | OUT 1,4 |
|  | M=5 | OUT 3,1 | OUT 3,2 | OUT 2,2 | OUT 3,2 | OUT 1,3 | OUT 2,3 |
|  |  | MUX 3,1 | MUX 3,2 | MUX 3,3 | MUX 3,4 | MUX 3,5 | MUX 3,6 |

US 9,954,698 B1

EFFICIENT RESOURCE SHARING IN A DATA STREAM PROCESSING DEVICE

BACKGROUND

Real time processing of a data stream, involving processing a series of digital data of significant or, in many applications, indefinite length, can require substantial hardware resources, such as multipliers, adders, and other arithmetic units. Additionally, it can be useful for a single device to be flexibly applied to perform processing of multiple data streams and/or accommodate processing data streams of various data rates. Often such flexibility or capability can be achieved by simply adding additional resources and, in some cases, shifting to a smaller and/or faster technology node. However, generally both of those approaches are undesirable.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 8C illustrates the selective couplings performed by each of the multiplexers MUX 1,1 to MUX 3,6 in response to the mode selection signal M for each of the five modes illustrated in FIG. 8B.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

Figure 1A:
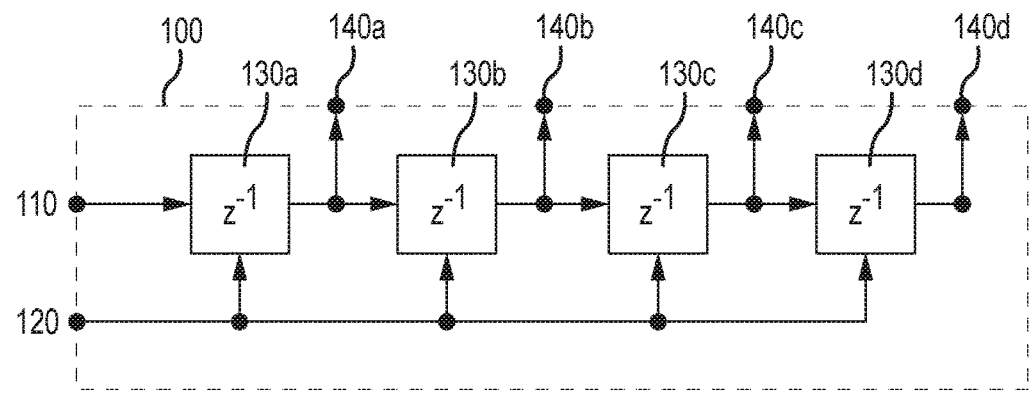
FIG. 1A illustrates an example of a digital delay line that generates a series of delayed digital data outputs based on input digital data.

FIG. 1A illustrates an example of a digital delay line 100 that generates a series of delayed digital data outputs 140a-140d of digital data values received via a incoming digital data input 110. The incoming digital data input 110 is configured to receive digital data values, such as, but not limited to, positive integer, signed integer, fixed point, or floating point numbers represented using a respective multibit binary format. Digital delay line 100 also includes a data available input 120, which receives a signal indicating when a new item or piece of digital data is available on incoming digital data input 110. Digital delay line 100 may be referred to as a "tapped delay line." Incoming digital data input 110 may be referred to as a "data input." Data available input 120 may be referred to as a "shift signal input."

Digital delay line 100 includes a plurality of successive delay units coupled to transfer digital data received via the incoming digital data input 110 through successive delay units in response to the data available input. The example illustrated in FIG. 1A includes four successive delay units 130a, 130b, 130c, and 130d; although in other implementations there may be less or more successive delay units included in a digital delay line. The delay units may be implemented using, for example, registers, clocked registers, flip flops, or shift registers. Each delay unit, or an output of each delay unit, may be referred to as a "tap" or "stage"; for example, digital delay line 100 illustrated in FIG. 1A may be referred to as a four stage digital delay line, a four tap digital delay line, or a tapped delay line with four taps. Digital delay line 100 includes a first delay unit 130a having an input coupled to incoming digital data input 110 and having an output coupled to an input of the next delay unit 130b in the series of successive delay units 130a-130d and also coupled to a first delayed digital output 140a. Digital delay line 100 includes a last delay unit 130d having an input coupled to an output of the prior delay unit 130c in the series of successive delay units 130a-130d and having an output coupled to a second delayed digital output 140d. Digital delay line 100 includes middle delay units (in the example illustrated in FIG. 1A, delay units 130b and 130c) between the first delay unit 130a and the last delay unit 130d, each having an input coupled to an output of the prior delay unit in the series of successive delay units 130a-130d (in FIG. 1A, the input of delay unit 130b is coupled to the output of delay unit 130a, and the input of delay unit 130c is coupled to the output of delay unit 130b) and having an output coupled to an input of the next delay unit in the series of successive delay units 130a-130d (in FIG. 1A, the input of delay unit 130b is coupled to the input of delay unit 130c, and the output of delay unit 130d is coupled to the input of delay unit 130d). Although the particular example illustrated in FIG. 1A has four successive delay units, additional middle delay units may be added, resulting in N successive delay units and N delayed digital data outputs. Also, one or both of middle digital delay units 130b and 130b may be omitted, resulting in a digital delay line with only 2 or 3 stages.

Figure 1B:
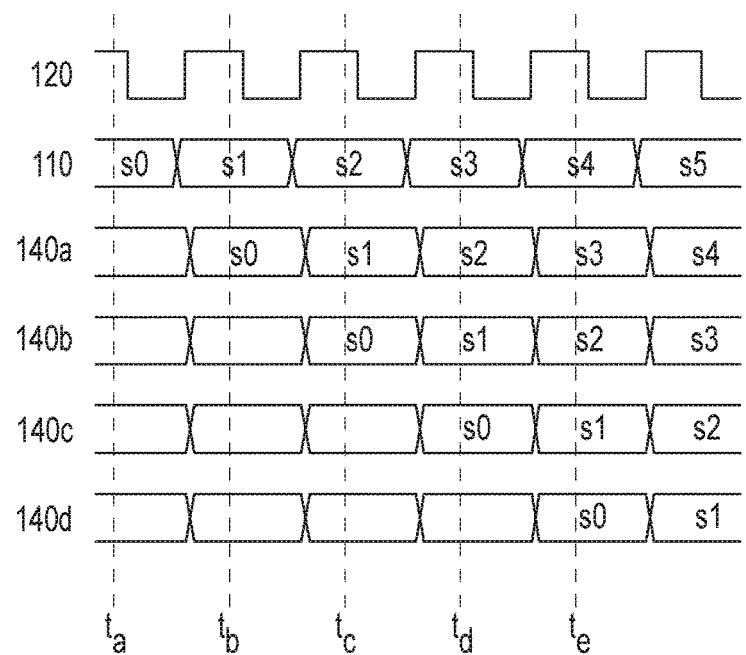
FIG. 1B illustrates an example of the digital delay line illustrated in FIG. 1A transferring digital data received via its incoming digital data input through its successive delay units in response to a rising edge of a signal received via its data available input indicating that new digital data is available.

Each of the successive delay units 130a-130d is also coupled to the data available input 120 and in response to data available input 120 indicating that new digital data is available on incoming digital data input 110, each digital delay unit transfers a digital data received on its input forward one stage to its output. FIG. 1B illustrates an example of transferring digital data received via the incoming digital data input 110 through the successive delay units 130a-130d in response to a rising edge of a signal received via data available input 120 indicating that new digital data is available. As successive new digital data values s0, s1, s2, s3, s4, and s5 are received via incoming digital data input 110, they are transferred forward through the successive delay units 130a-130d, such that at time $t_e$, the delayed digital data outputs 140a-140d output digital data s0 received at time $t_a$, digital data s1 received at time $t_b$, digital data s2 received at time $t_c$, and digital data s3 received at time $t_d$.

Although the particular example illustrated in FIGS. 1A and 1B involves receiving bits for digital data in parallel via digital data input 110 and transferring digital data through successive delay units on each rising edge of data available input 120, it is understood that other variations of digital delay line 100 are effective for the techniques discussed in this disclosure. For example, digital data may be provided in groups of X serial bits, with X transitions of data available input 120 to shift in each group. In some implementations, there may be fewer delayed digital data outputs than delay units. For example, only outputs from alternating delay units might be coupled to delayed digital data outputs.

Figure 2A:
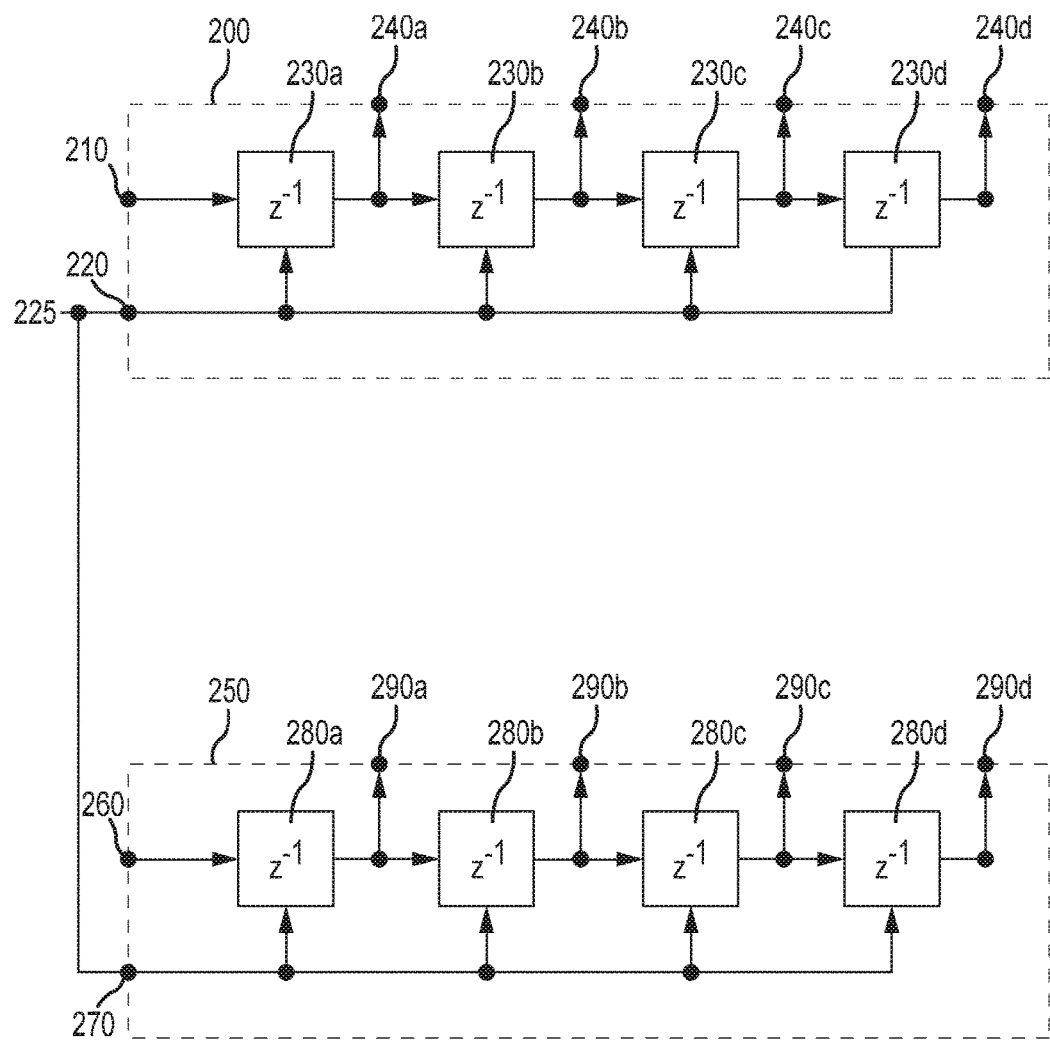
FIG. 2A illustrates an example including a first digital delay line that generates a series of first delayed digital data outputs of data values received via a first incoming digital data input and a second digital delay line that generates a series of second delayed digital data outputs of data values received via a second incoming digital data input, in which data values are transferred through the first and second digital delay lines in response to a common data available signal.

FIG. 2A illustrates an example including a first digital delay line 200 that generates a series of first delayed digital data outputs 240a-240d of data values received via a first incoming digital data input 210 and a second digital delay line 250 that generates a series of second delayed digital data outputs 240a-240d of data values received via a second incoming digital data input 260, in which data values are transferred through the first and second digital delay lines 200 and 250 in response to a common data available signal 225. The first and second digital delay lines 200 and 250 each operate in much the same manner as digital delay line 100 illustrated in FIG. 1A, including operation of a series of successive delay units 230a-230d in response to a first data available input 220 and operation of a series of successive delay units 280a-280d in response to a second data available input 270. In the example illustrated in FIG. 2A, first and second data available inputs 220 and 270 are coupled to receive the same data available signal 225. In some implementations, first and second data available inputs 220 and 270 may be selectively coupled, allowing the first and second digital delay line 200 and 250 to transfer received data values in response to different data available signals.

Figure 2B:
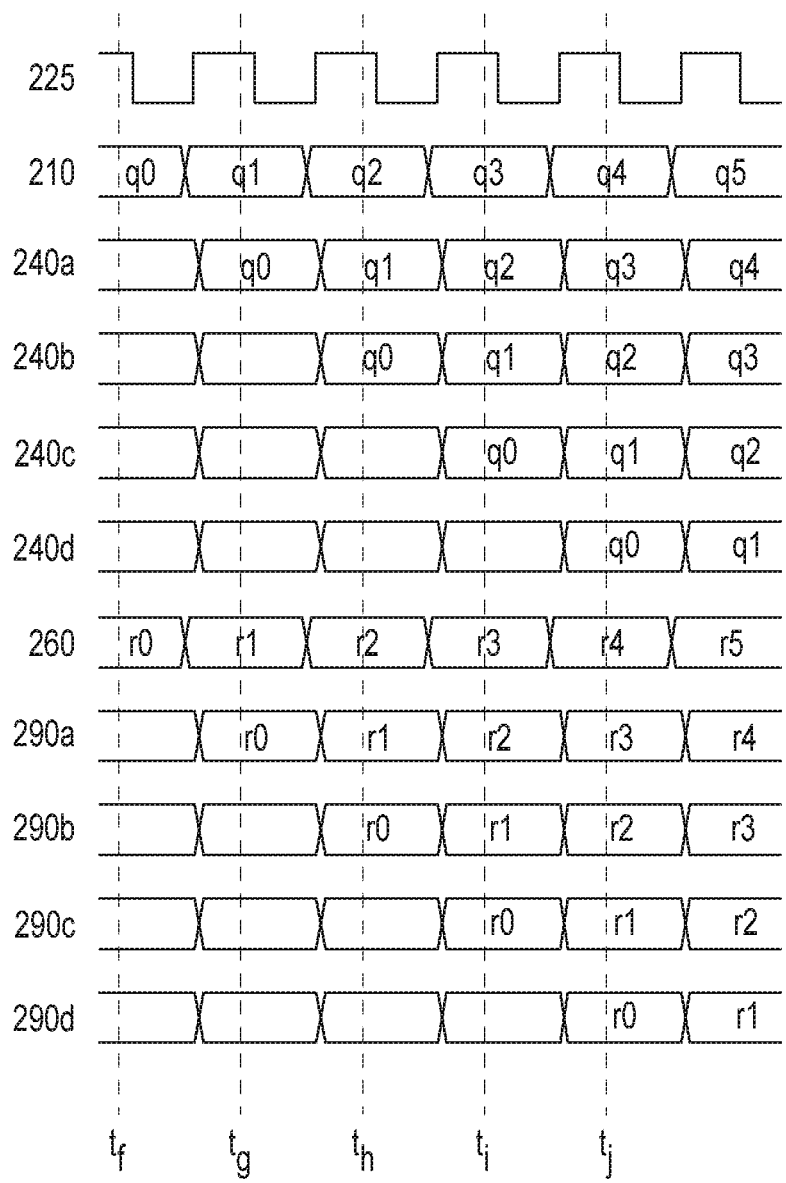
FIG. 2B illustrates an example of transferring digital data received via the first and second incoming digital data inputs through their respective successive delay units in response to a rising edge of a data available signal indicating that new digital data is available.

FIG. 2B illustrates an example of transferring digital data received via the first and second incoming digital data inputs 210 and 260 through the respective successive delay units 230a-230d and successive delay units 280a-280d in response to a rising edge of data available signal 225 indicating that new digital data is available. As successive new digital data values q0, q1, q2, q3, q4, and q5 are received via first incoming digital data input 210, they are transferred forward through the successive delay units 230a-230d, such that at time $t_e$, the delayed digital data outputs 240a-240d output digital data q0 received at time $t_f$, digital data q1 received at time $t_g$, digital data q2 received at time $t_h$, and digital data q3 received at time $t_i$. At the same time, successive new digital data values r0, r1, r2, r3, r4, and r5 are received via second incoming digital data input 216, and they are transferred forward through the successive delay units 280a-280d, such that at time $t_e$, the delayed digital data outputs 290a-290d output digital data r0 received at time $t_f$, digital data r1 received at time $t_g$, digital data r2 received at time $t_h$, and digital data r3 received at time $t_i$. As will be discussed in examples illustrated below, in some examples the digital data values q0-q5 and r0-r5 may be from a single original data stream providing data values in the order r0, q0, r1, q1, r2, q2, r3, q3, r4, q4, r5, q5, with alternating values from the original data stream being provided to the first and second incoming digital data inputs 210 and 260, much as illustrated by data stream 358 and data substreams 361 and 362 in FIG. 3 and in FIG. 9B.

Figure 3:
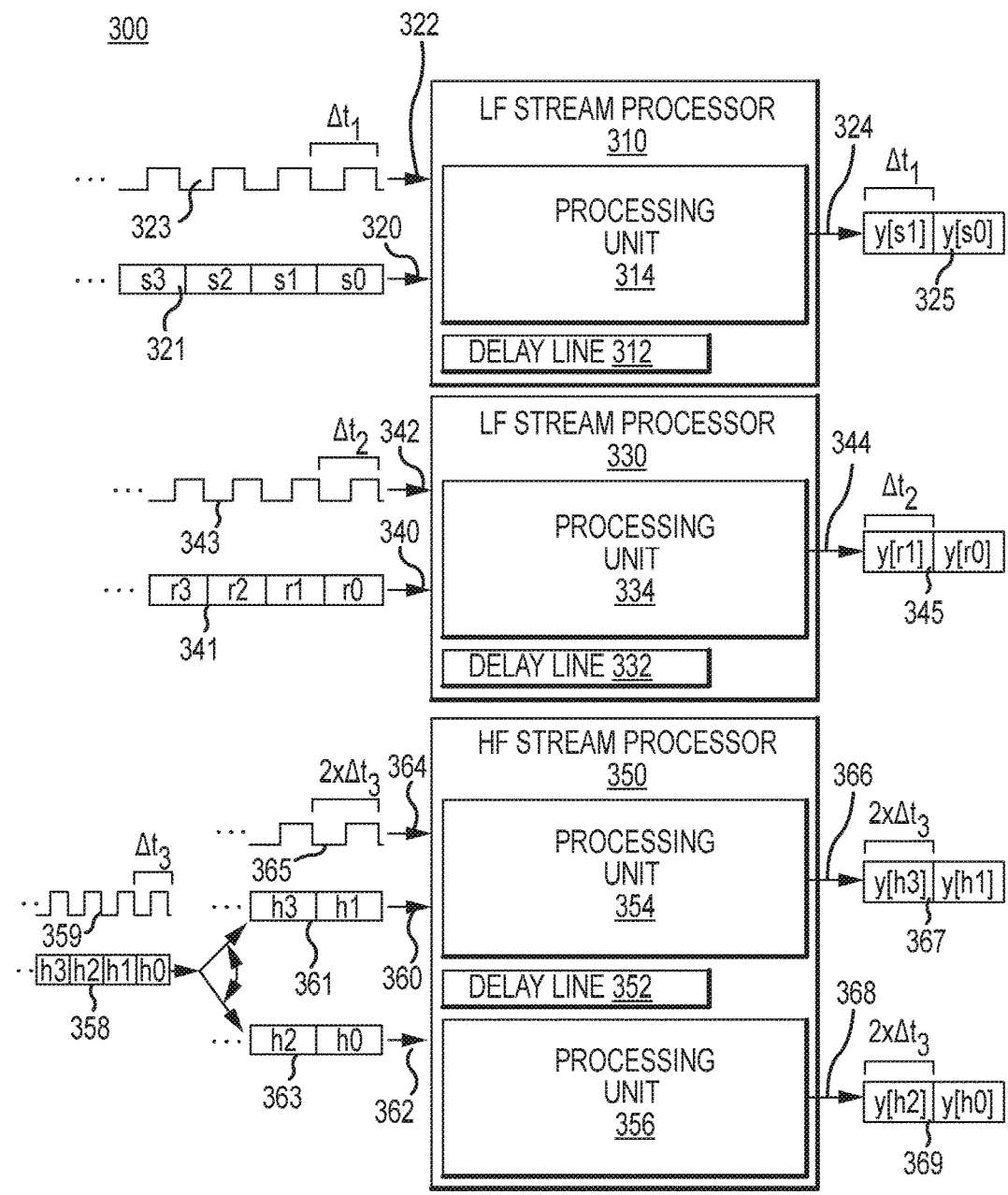
FIG. 3 illustrates an example of a data stream processing device adapted to perform stream processing of two digital data streams or a high frequency digital data stream.

FIG. 3 illustrates an example of a data stream processing device 300 adapted to perform stream processing of two digital data streams 321 and 341 or a high frequency digital data stream 358. Data stream processing device 300 includes a first low frequency (LF) stream processor 310, which includes an incoming digital data input 320 and a data available input 322 that operate in connection with tapped digital delay line 312 much as similar features illustrated in FIG. 1A, thereby generating a plurality of delayed digital data outputs for respective taps that are provided to a processing unit 314 included in the first LF stream processor 310. In some implementations, data values provided to the delay line 312 may be generated by a first processing of values received via incoming digital data input 320 (see, for example, FIG. 4). In the particular example illustrated in FIG. 3, a rising edge on data available input 322 indicates that new digital data is available on incoming digital data input 320, although other signaling techniques may be used. The first data stream processing device 310 includes a processing unit 314 that generates a digital data output 324 based on the delayed digital data output by the digital delay line 312. For example, if the delay line 312 includes N taps, the processing unit 314 may include N delayed digital data inputs each coupled to a respective one of the N taps. Processing unit 314 may be referred to as a "data processing unit", a "digital data processing unit", or a "digital data processor".

Processing unit 314 is configured to perform a function (which, for FIG. 3, will be referred to as "y") responsive to the delayed digital data received from digital delay line 312 to generate digital data output 324 based on the delayed digital data received from digital delay line 312. The function may also be referred to as a "process", a "processing", or a "procedure". Typically, the function is deterministic. Performing the function may include performing a set of one or more operations, in sequence and/or combination, on the delayed digital data received from digital delay line 312. Such operations may include, but are not limited to, bitwise logical operations (such as, but not limited to, NOT, AND, OR, XOR, left shift, and right shift) and arithmetic operations (such as, but not limited to, addition, subtraction, multiplication, division, logarithmic, exponential, trigonometric, statistic, and comparison operations). In some implementations, one or more of the operations may be performed according to a clock signal (not illustrated in FIG. 3) received by processing unit 314; for example, the operations may be performed in a series of intermediate stages driven by the clock signal. In some implementations, processing unit 314 may include a programmable processor that executes one or more program instructions to perform the function or a portion of the function. The function performed by processing unit 314 may further be responsive to other digital data inputs provided to and/or stored by processing unit 314. In some implementations, processing unit 314 may include or be configured to access register or memory elements that store operands, control values, or other data provided for or to control the function performed by processing unit 314 to generate digital data output 324. For example, coefficient values for arithmetic operations might be stored in registers, rather than being "hard coded" into the processing unit 314. In an example in which processing unit 314 implements a digital filter, processing unit 314 may be referred to as a "filter" or a "digital filter".

Figure 4:
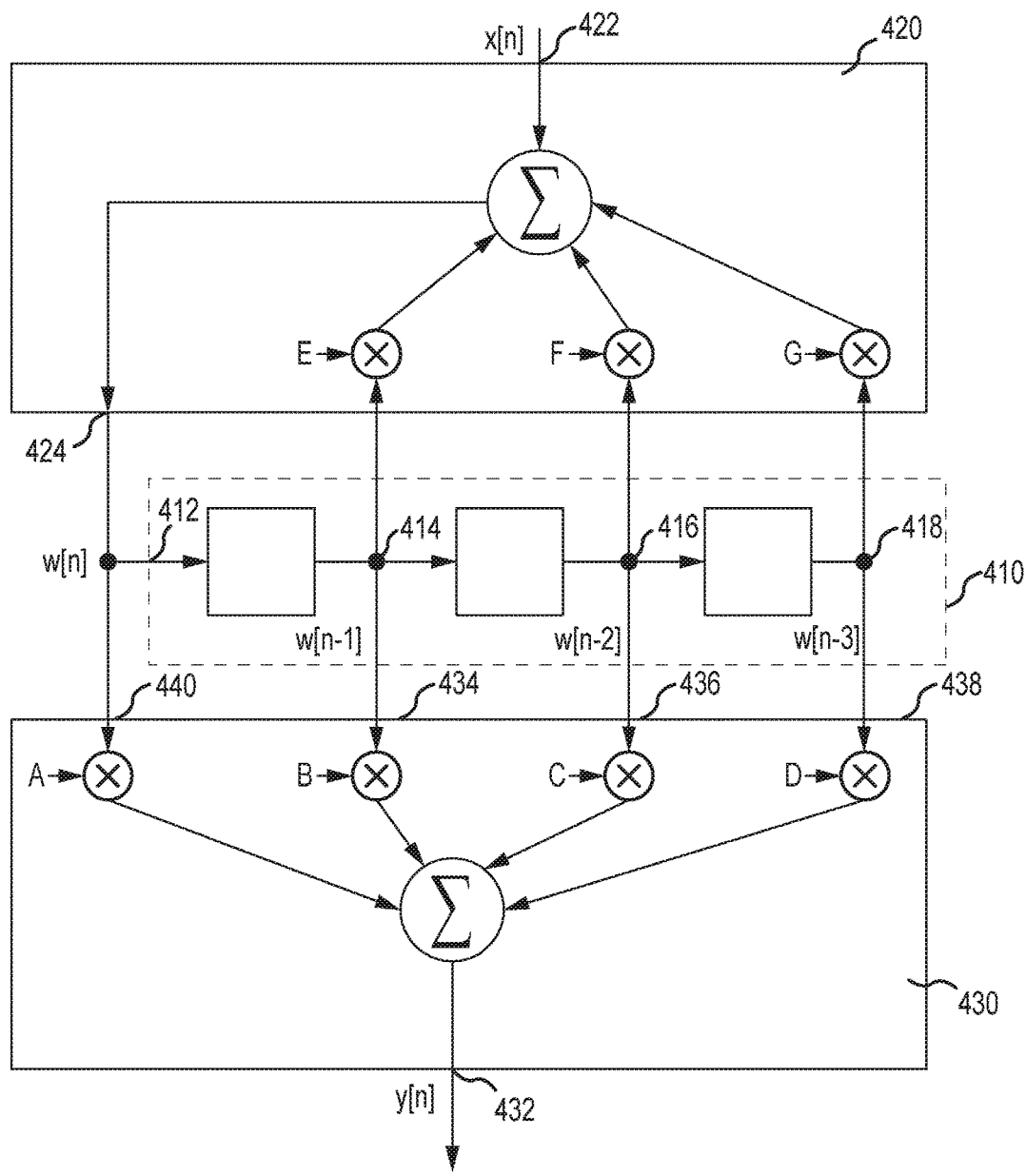
FIG. 4 illustrates an example of how delayed data values generated by a tapped digital delay line may be provided to one or more processing units for generating output values based on the delayed data values.

FIG. 4 illustrates an example of how delayed data values generated by a tapped digital delay line may be provided to one or more processing units for generating output values based on the delayed data values. The approaches illustrated in FIG. 4 may be used in, for example, LF stream processor 310 in FIG. 3 for coupling taps from delay line 312 to respective delayed digital data inputs included in processing unit 314 to generate digital data output 324 based on the delayed digital data provided via the taps.

The particular example illustrated in FIG. 4 implements a "direct form II" realization of an infinite impulse response (IIR) filter. A first processing unit 420 receives data values from a data stream "x" (with a current value "x[n]") and delayed data values from taps 414, 416, and 418 (with respective current values "w[n−1]", "w[n−2]", and "w[n−3]") of digital delay line 410. The first processing unit 420 is configured to perform a first function, much as described in connection with processing unit 314, to generate digital data output 424 (with a current value of w[n]=x[n]+E×w[n−1]+F×w[n−2]+G×w[n−3]); for example, the first function may be performed using multiplier circuits and a summation circuit. The digital data output 424 is coupled to an incoming digital data input 412 of the digital delay line 410, which operates much as digital delay line 100 illustrated in FIG. 1A. For purposes of illustration, a counterpart to data available input 120 is not illustrated in FIG. 4. As the first processing unit 420 generates digital data output 424 based on data values previously output on digital data output 424, the first processing unit 420 may be described as receiving feedback, performing feedback, or as being recursive. A second processing unit 430 includes delayed digital data inputs 434, 436, and 438 respectively coupled to taps 414, 416, and 418 and a digital data input 440 coupled to digital data output 424. The second processing unit 430 is configured to perform a second function, much as described in connection with processing unit 314, to generate digital data output 432 (with a current value of y[n]=A×w[n]+B×w[n−1]+C×w[n−2]+D×w[n−3]); for example, the second function may be performed using multiplier circuits and a summation circuit. Coefficient values A, B, C, D, E, F, and G may be received from, for example, one or more registers. Although FIG. 4 illustrates a third-order IIR filter, higher order filtering may be implemented by increasing the number of taps in digital delay line 410 and the number of coefficients and multiplication operations applied thereto in the first and second processing units 420 and 430. In some implementations, the first processing unit 420 may be omitted and data stream "x" instead provided to data input 412 to implement a finite impulse response (FIR) filter outputting y[n]=A×x[n]+B×x[n−1]+C×x[n−2]+D×x[n−3]. In some implementations, the second processing unit 430 may be omitted.

The data stream processing device 300 illustrated in FIG. 3 also includes a second low frequency (LF) stream processor 330, which operates in essentially the same manner as the first RF stream processor 310. The second LF stream processor 330 includes a digital delay line 332 having an incoming digital data input 340 and a data available input 342 operating in connection with tapped digital delay line 312 to generate a plurality of delayed digital data outputs for respective taps. Processing unit 334 may be implemented much as discussed above for processing unit 314, with processing unit 334 configured to perform the function "y" (the same function performed by processing unit 314) using the plurality of delayed digital data outputs received from digital delay line 332 to generate a digital data output 344 based on the plurality of delayed digital data outputs received from digital delay line 332. The first and second LF stream processors 310 and 330, which are both configured to perform the function "y", are essentially interchangeable: given the same input signals (including, for example, delayed digital data, additional inputs that provide configuration settings, provide values from external registers, store values in internal registers, and/or provide program code), they will generate the same digital data output signals.

In first LF stream processor 310, a single processing unit 314 is used to generate all of the digital data output generated for digital data received from data stream 321. Data stream 321 includes a series of successive digital data values s0, s1, s2, and s3, and each rising edge on data available signal 323 indicates when a new digital data value is available for the first LF stream processor 310, such as when the digital data values s0, s1, s2, and s3 are respectively available. For the illustrated waveforms for data stream 321 and data available signal 323, as well as other waveforms illustrated in FIG. 3, time advances from right to left. By applying the function y with each transfer of data values received via digital data input 340 from one stage to the next, processing unit 314 generates a series of digital data output values (which may be referred to as a data stream 325) on digital data output 324 based on delayed digital data values from data stream 321 received via delay line 312, including the successive output values y[s0], y[s1], y[s2], and y[s3] (with "y[X]" indicating the first data output value generated based on the delayed digital data value X).

In the example illustrated in FIG. 3, there is a first amount of time (or period) $\Delta t_1$ between successive new digital data values received on digital data input 320 from data stream 321, and there also is the first amount of time $\Delta t_1$ between successive new digital data output values being output by processing unit 314. Additionally, processing unit 314 has an expected minimum time between successive outputs: a second amount of time (or period) $\Delta t_P$. For example, in an embodiment in which processing unit 314 was expected to be able to successfully generate new data values on digital data output 324 at rates up to 100 MHz, $\Delta t_P$ would be 10 ns. The second amount of time $\Delta t_P$ may be a result of factors such as, but not limited to, a supplied clock rate, a critical delay path in its circuits, or a process technology (for example, 65 nm CMOS versus 45 nm CMOS). The first amount of time $\Delta t_1$ for digital data stream 321 is greater than the second amount of time $\Delta t_P$; accordingly, the rate at which data stream 321 provides new values does not exceed an expected maximum rate at which processing unit 314 can generate new output values based on the values received from data stream 321.

The digital data stream 341 and its corresponding data available signal 343 are processed by second LF stream processor 330, using processing unit 334 to generate digital data output 344, in much the same manner as first LF stream processor 310. Since processing unit 334 performs the same function "y" as processing unit 314, the same expected minimum time between successive outputs for the processing unit 334, the second amount of time $\Delta t_P$, is assumed to also apply to processing unit 334. Data stream 341 includes a series of successive digital data values r0, r1, r2, and r3. Processing unit 334 generates a series of digital data output values (which may be referred to as a data stream 345) on digital data output 344 based on delayed digital data values from data stream 341 received via delay line 342, including y[r0], y[r1], y[r2], and y[r3]. In the example illustrated in FIG. 3, there is a third amount of time (or period) $\Delta t_2$ between successive new digital data values received on digital data input 340 from data stream 341, and there also is the third amount of time $\Delta t_2$ between successive new digital data values being output by processing unit 334 on the digital data output 344. The third amount of time $\Delta t_2$ is shorter than the first amount of time $\Delta t_1$, but is still greater than the second amount of time $\Delta t_P$; accordingly, the rate at which digital data stream 341 provides new values does not exceed an expected maximum rate at which processing unit 334 can generate new output values based on the values received from data stream 341.

As configured in FIG. 3, neither of first and second LF stream processors 310 and 330 can process a data stream with a digital data rate exceeding $1/\Delta t_P$, due to the limitations of their respective processing units 314 and 334, and accordingly are referred to as "low frequency" stream processors. For example, there is a fourth amount of time (or period) $\Delta t_3$ between successive new digital data values from data stream 358. In some examples, the amounts of time $\Delta t_1$, $\Delta t_2$, $\Delta t_3$, and $\Delta t_P$ may be measured as a difference in time between two successive digital data; and in some examples, they may be measured as an average time between successive data values over a larger number of data values. However, since this fourth amount of time $\Delta t_3$ is shorter than the second amount of time $\Delta t_P$, neither of the first and second LF stream processors 310 and 330 can successfully process data stream 358 individually. Although engineering efforts may be made to reduce $\Delta t_P$, the effort or techniques involved (for example, changing to a faster technology node) may not be desirable.

Data stream processing device 300 includes a "high frequency" (HF) stream processor 350 that addresses the limitations reflected by the second amount of time $\Delta t_P$. Instead of one digital data input, HF stream processor 350 includes two digital data inputs 360 and 362, and each time data available input 364 receives an indication that new digital data is available (for example, a rising edge on data available signal 365), a delay line 352 included in HF stream processor 350 receives two new successive digital data values from data stream 358 in parallel: one value from digital data input 360 and the other value from digital data input 362. The original data stream 358 includes a series of successive digital data values h0, h1, h2, and h3 with the fourth amount of time $\Delta t_3$ between successive values. In a "round robin" or "ping pong" fashion, the digital data from the original data stream 358 are provided to HF stream processor 350 as two data substreams 361 and 363 via the two digital data inputs 360 and 362, with new digital data values being provided on these inputs at half the rate of data stream 358. Accordingly, a time (or period) between successive indications of new digital data by digital data available signal 365 is twice that of digital data available signal 359, or $2 \times \Delta t_3$, which, in this example, is greater than second amount of time $\Delta t_P$.

Processing of the digital data received via digital data inputs 360 and 362 is divided evenly between, and performed concurrently by, a first processing unit 354 and a second processing unit 356 included in HF stream processor 350. The first processing unit 354 may be implemented much as discussed above for processing units 314 and 334, with the first processing unit 354 configured to perform the function "y" (the same function performed by processing units 314 and 334) using a first plurality of delayed digital data outputs received from digital delay line 352 to generate a digital data output 366 based on the first plurality of delayed digital data outputs. The second processing unit 356 may be implemented much like the first processing unit 354, with the second processing unit 356 configured to perform the function "y" (the same function performed by the first processing unit 354) using a second plurality of delayed digital data outputs (at least one of which is different than the first plurality of delayed digital data outputs) to generate a digital data output 368 based on the second plurality of delayed digital data outputs. As a result, the second processing unit 356 generates a series of digital data output values (which may be referred to as a data substream 367) on digital data output 366, including successive output values y[h0] and y[h2] at a same time that the first processing unit 356 generates a series of digital data output values (which may be referred to as a data substream 369) on digital data output 368, including y[h1] and y[h3]. There is the amount of time $2 \times \Delta t_3$ between successive new digital data values being output by each of the first and second processing units 354 and 356.

As a result, HF stream processor 350 can process data streams that deliver new data values faster than the maximum rate of $1/\Delta t_P$ for LF stream processors 310 and 330. This can be useful for real time signal processing, in which processing of a high rate continuous data stream of indefinite duration is desired; for example, RF signal demodulation applications. However, this approach has a resource cost. For example, in order to produce a data stream processing device that can support processing two concurrent LF data streams or a single HF data stream—for example, performing concurrent demodulation for two narrowband carriers or a single wideband carrier—hardware processing units are duplicated for supporting processing of the HF data stream, as illustrated by the data stream processing device 300 in FIG. 3. The hardware elements for the duplicated processing units can require substantial device area and/or resources; for example, the area for multiplier circuits and summation circuits to implement a high order FIR or IIR filter can be substantial.

Figure 5:
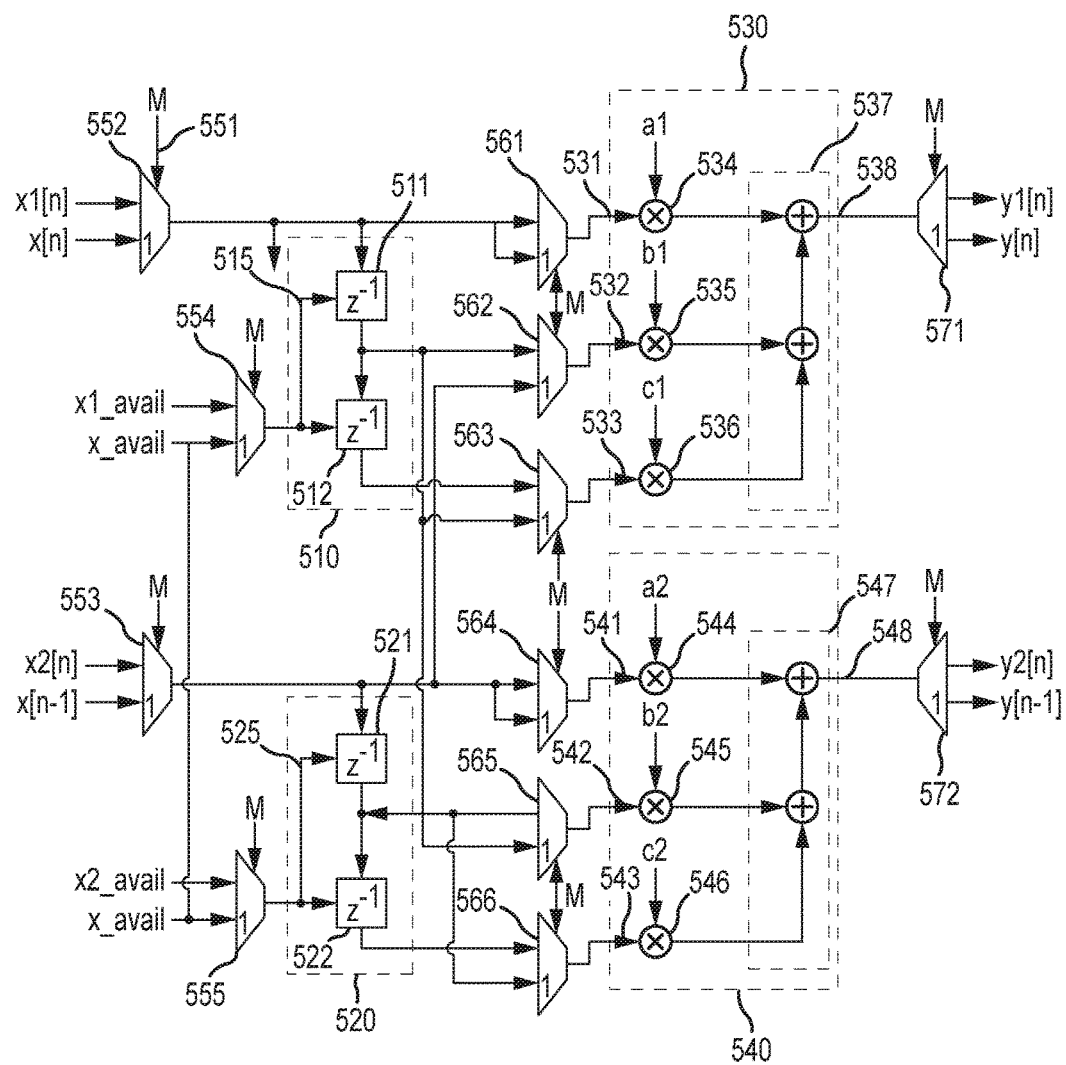
FIG. 5 illustrates an example of a data stream processing device configured to reuse first and second processing units, allowing the first and second processing units to be operated independently for processing two digital data streams or in parallel for processing one digital data stream.

FIG. 5 illustrates an example of a data stream processing device 500 configured to reuse first and second processing units 530 and 540, allowing the first and second processing units 530 and 540 to be operated independently for processing two digital data streams or in parallel for processing one digital data stream. The data stream processing device 500 includes first and second digital delay lines 510 and 520 that each operate much as digital delay line 100 illustrated in FIG. 1A. In this example, the first and second digital delay lines 510 and 520 each have two taps, but in other implementations there may more taps. The data stream processing device 500 also includes first and second processing units 530 and 540, which may be implemented much as discussed above for any of the processing units 314, 334, 354, 356, and 430. The first and second processing 530 and 540 units perform the same function (which, for FIG. 5, will be referred to as "y") implementing the transfer function H(z) $=a+bz^{-1}+cz^{-2}$. The first processing unit 530 includes multiplier circuits 534, 535, and 536 and a summation circuit 537, and the second processing unit 540 includes similarly arranged multiplier circuits 544, 545, and 546 and a summation circuit 547. In some implementations, the coefficients a1, b1, c1, a2, b2, and c2 may be provided via one or more programmable registers.

In contrast to the example illustrated in FIG. 4, the taps of the first and second digital delay lines 510 and 520 are not directly coupled to directly coupled to the delayed digital data inputs 532, 533, 542, and 543 of the first and second processing units. Data stream processing device 500 includes control circuitry, including a mode selection input 551 (receiving a mode selection signal M), that selectively couples signals received by data stream processing device 500 to the first and second digital delay lines 510 and 520, and selectively couples delayed digital data outputs of first and second digital delay lines 510 and 520 to delayed digital data inputs of first and second processing units 530 and 540. Data stream processing device 500 is configured to operate according to two modes: a first mode (M=0) where the first and second processing units 530 and 540 operate independently on respective data streams x1 (with a current value of x1[n]) and x2 (with a current value of x2[n]) to generate respective digital data outputs y1 (with a current value of y1[n]) and y2 (with a current value of y2[n]), and a second mode (M=1) where the first and second processing units 530 and 540 operate in parallel on data values received from a single original data stream x (with a current value of x[n] and a value x[n−1] immediately preceding the value x[n] in the data stream x).

As illustrated in FIG. 5, the control circuitry includes a multiplexer 552 which, in response to the mode selection signal M, selectively couples either data stream x1 or a first substream of data stream x to an incoming data input of first digital delay line 510 and digital data input 531 of first processing unit 530. Multiplexer 552, as well as the other multiplexers described herein, may also be referred to as a "switch", "multiple input, single output switch," "switching element", "mux", "signal selector", or "data selector." The control circuitry includes a multiplexer 554 which, in response to the mode selection signal M, selectively couples either the signal x1_avail (indicating a new data value is available from data stream x1) or the signal x_avail (indicating a new pair of data values is available from data stream x) to available input 515 of the first digital delay line 510. The control circuitry also includes similar multiplexers 553 and 555 for the second digital delay line 520. In the second mode (M=1), the digital data values x[n] and x[n−1] are alternating samples for the single data stream x that are delivered in parallel, much as described for data stream 358 and digital data inputs 360 and 362 for HF stream processor 350 in FIG. 3.

For the first processing unit 530, the control circuitry includes multiplexer 561 for coupling digital data signals to the digital data inputs 531, and also includes multiplexers 562 and 563 for selectively coupling delayed digital data inputs 532 and 533 to taps of the first and second digital delay units 510 and 520 in response to the mode selection signal M. The control circuitry includes similar multiplexers 564, 565, and 566 for the second processing unit 540. In some implementations, one or both of first and second processing units 530 and 540 may be provided with first and second register banks respectively storing coefficients for the first and second modes, and in response to the mode selection signal M, the control circuitry may be selectively coupled to provide coefficients stored from either the first register bank or the second register bank to the first and second processing units 530 and 540. In some implementations, in the second mode, coefficients a1 and a2 may have the same value, coefficients b1 and b2 may have the same value, and coefficients b1 and b2 may have the same value. In some examples, as illustrated in FIG. 5, the control circuitry may include multiplexers 571 and 572 for selective coupling of respective digital data outputs 538 and 548 in response to the mode selection signal M.

In the first mode (M=0), the first delay line 510 and the first processing unit 530 operate on data values from data stream x1, and the second delay line 520 and the second processing unit 540 operate together, and independently from the first delay line 510 and the first processing unit 530, on data values from data stream x1. The resulting equations for the digital data output by the first and second processing units 530 and 540 are:

$$y1[n]=a1\times x1[n]+b1\times x1[n-1]+c1\times x1[n-2] \qquad \text{Eq. (1)}$$

$$y2[n]=a2\times x2[n]+b2\times x2[n-1]+c2\times x2[n-2] \qquad \text{Eq. (2)}$$

with a delayed digital data output by delay unit 511 designated "x1[n−1]", a delayed digital data output by delay unit 512 designated "x1[n−2]", a delayed digital data output by delay unit 521 designated "x2[n−1]", and a delayed digital data output by delay unit 522 designated "x2[n−2]".

In the second mode (M=1), the first and second delay lines 510 and 520 and the first and second processing units 530 and 540 operate together on data values from the single data stream x, receiving pairs of digital data values in parallel as respective inputs x[n] and x[n−1]. The resulting equations for the digital data output by the first and second processing units 530 and 540 (assuming a1=a2=a, b1=b2=b, and c1=c2=c) are:

$$y[n]=a\times x[n]+b\times x[n-1]+c\times x[n-2] \qquad \text{Eq. (3)}$$

$$y[n-1]=a\times x[n-1]+b\times x[n-2]+c\times x[n-3] \qquad \text{Eq. (4)}$$

with a delayed digital data output by delay unit 511 designated "x[n−2]" and a delayed digital data output by delay unit 521 designated "x[n−3]". In some implementations, delay units 512 and 522 may be disabled in the second mode, since their outputs are not used in the second mode.

Thus, in the second mode, the first and second delay lines 510 and 520 and the first and second processing units 530 and 540 operate together much like the HF stream processor 350 in FIG. 3, allowing the first and second processing units 530 and 540 to generate new digital data output values for data stream x at only half the rate of data stream x. As a result, the data stream processing device 500, like the data stream processing device 300 illustrated in FIG. 3, supports processing two concurrent LF data streams or a processing a single HF data stream, but does so with only two processing units 530 and 540 (rather than the four processing units 314, 334, 354, and 356 in FIG. 3) with the addition of the above control circuitry, which typically demands far fewer hardware resources than the two omitted processing units. Higher order FIR filtering may be implemented much as discussed in connection with FIG. 4, along with accompanying changes in the control circuitry, as discussed in connection with FIGS. 7A-7C.

Figure 6A:
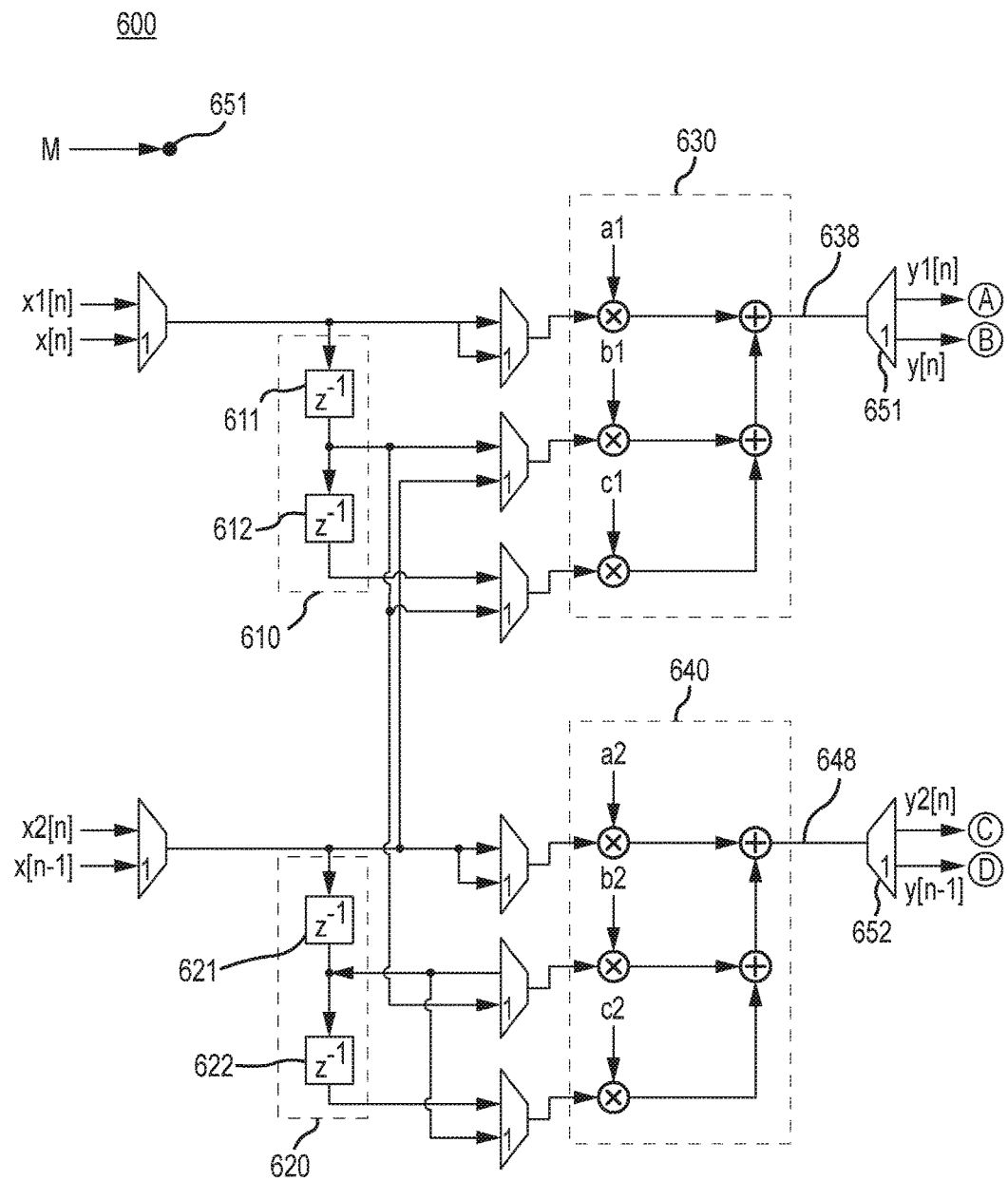
FIGS. 6A and 6B illustrate an example of a data stream processing device that performs IIR filtering and, like the example illustrated in FIG. 5, allows processing units to be operated independently for processing two digital data streams or in parallel for processing one digital data stream.
Figure 6B:
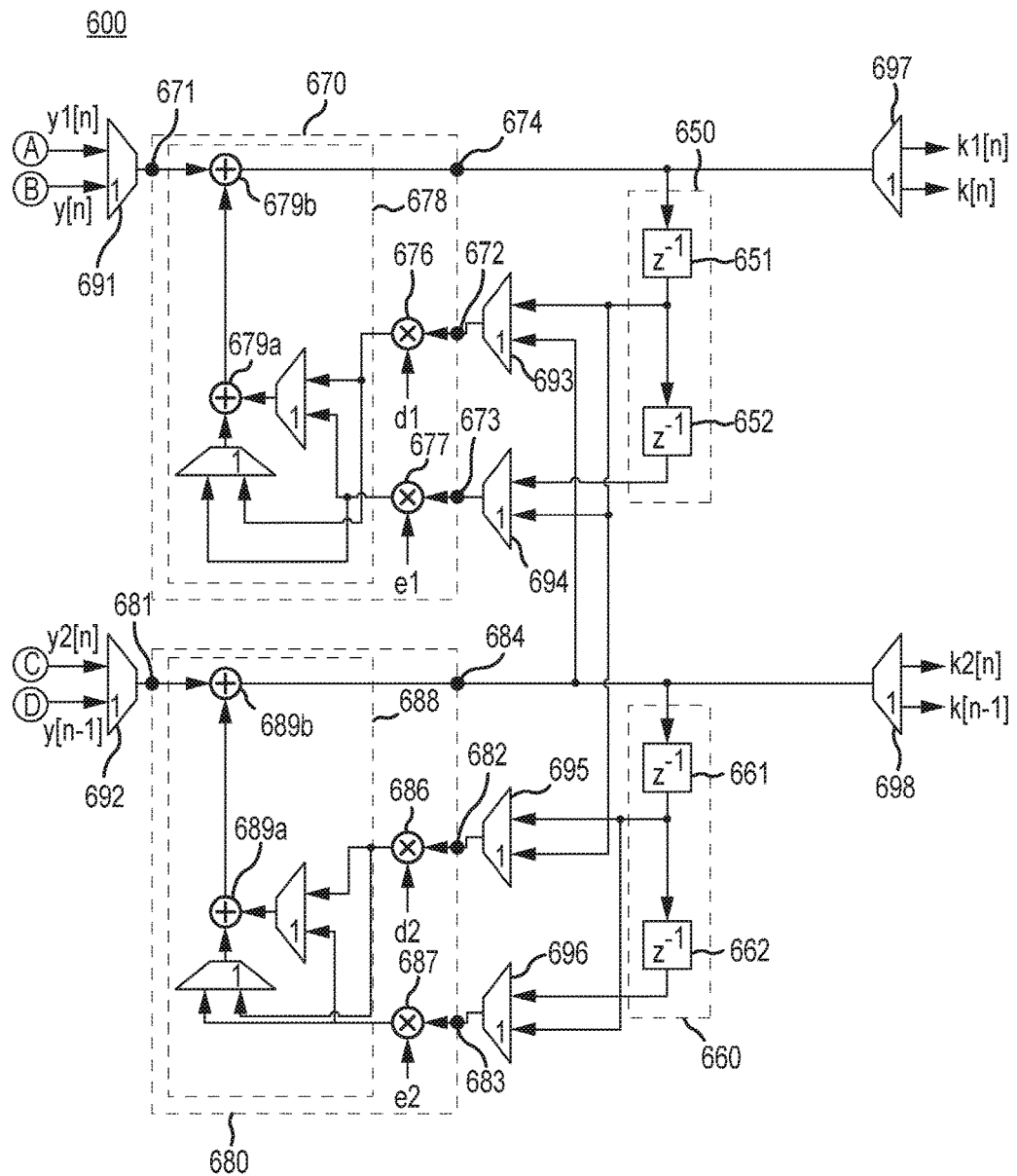

FIGS. 6A and 6B illustrate an example of a data stream processing device 600 that performs IIR filtering and, like the example illustrated in FIG. 5, allows processing units to be operated independently for processing two digital data streams or in parallel for processing one digital data stream. The particular example illustrated in FIGS. 6A and 6B implements a "direct form I" realization of an IIR filter. As with the example illustrated in FIG. 5, the data stream processing device 600 can be operated in a first mode (M=0) for independent processing of two digital data streams or in a second mode (M=1) for parallel processing of a single data stream, with the mode indicated by a mode selection signal M received via a mode selection input 651. Although not illustrated in FIGS. 6A and 6B in the same manner as in FIG. 5, the mode selection signal M is provided to each of the multiplexers in FIGS. 6A and 6B. Also, control circuitry related to data available inputs for the digital delay lines 610, 620, 650, and 660 has not been illustrated in FIGS. 6A and 6B, although such control circuitry may be implemented in much the same manner discussed in connection with FIG. 5. A feed forward portion of the data stream processing device 600, including first and second digital delay lines 610 and 620, first and second processing units 630 and 640, and related control circuitry, is illustrated in FIG. 6A. The feed forward portion of the data stream processing device 600 operates in much the same manner as the data stream processing device 500; accordingly, it will not be discussed in detail.

FIG. 6B illustrates a feedback portion of the data stream processing device 600, including third and fourth digital delay lines 650 and 660, third and fourth processing units 670 and 680, and related control circuitry. The third processing unit 670 implements feedback much as discussed above for processing unit 420 illustrated in FIG. 4. The third processing unit 670 performs a same function (which, for FIG. 6B, will be referred to as "k") responsive to digital data input 671 and delayed digital data inputs 672 and 673 to generate a third digital data output 674 based on the digital data inputs 671, 672, and 673. The third processing unit 670 includes multiplier circuits 676 and 677 and a summation circuit 678 including adders 679a and 679b. Together, the first and third processing units 630 and 670 implement the transfer function $$H(z) = \frac{a1 + b1 \cdot z^{-1} + c1 \cdot z^{-2}}{1 + d \cdot z^{-1} + e \cdot z^{-2}}$$ Eq. (5)

The fourth processing unit 680 is implemented in much the same manner as the third processing unit 670, likewise operating in connection with the second processing unit 640. The coefficients illustrated in FIGS. 6A and 6B may be provided to their respective processing units as described for the coefficients in FIG. 5. The third digital delay line 650 operates and is arranged much as the first digital delay line 610 (in FIG. 6A) and first delay line 510 (in FIG. 5). The fourth digital delay line 660 operates much as the third digital delay line 650.

Much as with data stream processing device 500 illustrated in FIG. 5, data stream processing device 600 includes control circuitry that selectively couples signals received by data stream processing device 600 to the first and second digital delay lines 610 and 620, selectively couples delayed digital data outputs of first and second digital delay lines 610 and 620 to digital data inputs of first and second processing units 630 and 640, further couples the first and third processing units 630 and 670 (via multiplexers 651 and 691, which in some implementations may be omitted to instead directly couple digital data output 638 to digital data input 671), further couples the second and fourth processing units 640 and 680 (similarly via multiplexers 652 and 692), further selectively couples delayed digital data outputs of third and fourth digital delay lines 650 and 660 to digital data inputs of third and fourth processing units 670 and 680 (via multiplexers 693, 694, 695, and 696), and further selectively couples third and fourth digital data outputs 674 and 684 to other circuits (via multiplexers 697 and 698). In the example illustrated in FIG. 6B, the control circuitry further includes the multiplexers illustrated in summation circuits 678 and 688, which may be replaced with direct connections with their respective multiplier circuit outputs in some implementations.

In the first mode (M=0), the first delay line 610 and the first processing unit 630 operate together to generate an intermediate digital data output y1[n] based on x1[n], and the third delay line 650 and the third processing unit 670 operate together to generate the digital data output k1[n] based on x1[n]; also, the second delay line 620 and the second processing unit 640 operate together to generate an intermediate digital data output y2[n] based on x2[n], and the fourth delay line 660 and the third processing unit 680 operate together to generate the digital data output k2[n] based on x2[n]. Accordingly, the first mode allows separate processing of two individual data streams x1 and x2. The resulting equations for the digital data output by the third and fourth processing units 670 and 680 are:

$k1[n]=a1 \times x1[n]+b1 \times x1[n-1]+c1 \times x1[n-2]-d1 \times k1[n-1]-e1 \times k1[n-2]$ Eq. (6)

$k2[n]=a2 \times x2[n]+b2 \times x2[n-1]+c2 \times x2[n-2]-d2 \times k2[n-1]-e2 \times k2[n-2]$ Eq. (7)

In the second mode (M=1), the first and second delay lines 610 and 620, the first and second processing units 630 and 640, the third and fourth delay lines 650 and 660, the third and fourth processing units 670 and 680 operate together on data values from the single data stream x, receiving pairs of digital data values in parallel as respective inputs x[n] and x[n−1]. The resulting equations for the digital data output by the third and fourth processing units 670 and 680 (assuming a1=a2=a, b1=b2=b, c1=c2=c, d1=d2=d, and e1=e2=e) are:

$$k[n]=a{\times}x[n]+b{\times}x[n-1]+c{\times}x[n-2]-d{\times}k[n-1]-e{\times}k[n-2] \quad \text{Eq. (8)}$$

$$k[n-1]=a{\times}x[n-1]+b{\times}x[n-2]+c{\times}x[n-3]-d{\times}k[n-2]-e{\times}k[n-3] \quad \text{Eq. (9)}$$

Higher order filtering may be implemented much as discussed in connection with FIGS. 4 and 5, along with accompanying changes in the control circuitry, as discussed in connection with FIGS. 7A-7C.

Figure 7A:
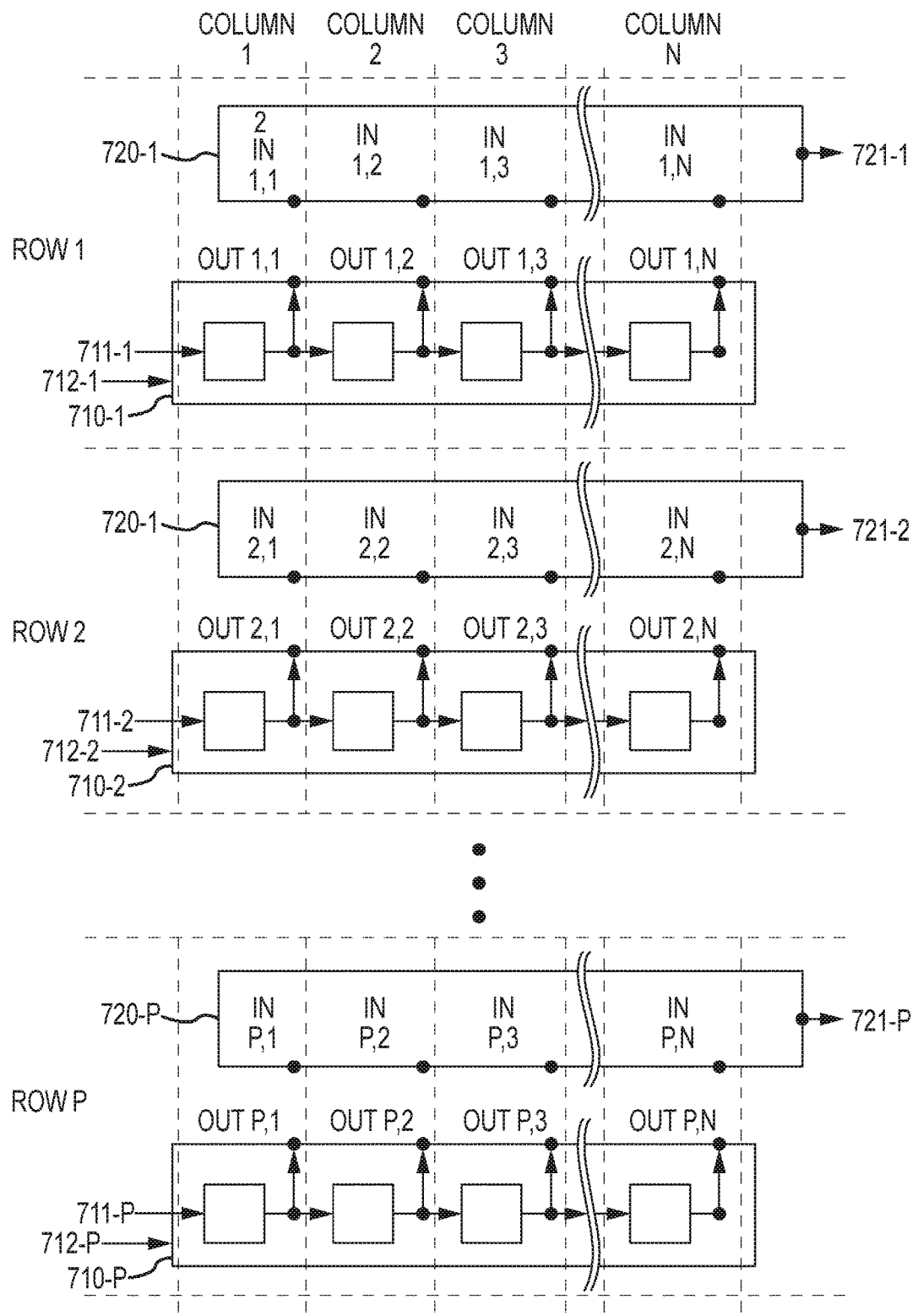
FIG. 7A illustrates aspects of determining arrangements and/or configurations of control circuitry to perform processing of a single digital data stream with P digital delay units each including N delayed digital data outputs and P processing units each including N digital data inputs for receiving delayed digital data used in parallel on the single data stream.

FIG. 7A illustrates aspects of determining arrangements and/or configurations of control circuitry to perform processing of a single digital data stream with P digital delay units each including N delayed digital data outputs and P processing units each including N digital data inputs for receiving delayed digital data used in parallel on the single data stream. In each of the data stream processing devices 500 and 600 illustrated in FIGS. 5-6B, by supplying new digital data in pairs and parallel processing using pairs of processing units in their respective second modes (M=1), a maximum frequency for a data stream can be doubled to $2/\Delta t_P$, versus a lower maximum frequency of $1/\Delta t_P$ in their respective first modes (M=0). The maximum frequency can be further increased by performing parallel processing using a larger number of processing units and accordingly increasing the number of new digital data being provided in parallel to respective digital delay lines. Where a number P processing units (P being one or more) are similarly used to perform parallel processing of new digital data received in groups of P new digital data, the maximum frequency can reach $P/\Delta t_P$. The ability to increase the maximum frequency in this way can be particularly useful when increasing the number of digital data inputs for the processing units causes (such as by implementing higher order filtering) $\Delta t_P$ to increase. Also, recent RF (radio frequency) signal demodulation approaches involving direct ADC (analog to digital converter) conversion of an RF signal have a corresponding need to perform real time processing of data streams of digital data at rates over 1 GSPS.

FIG. 7A illustrates P digital delay lines 710-1, 710-2, ..., 710-P, which each operate much as digital delay line 100 and each include N successive delay units with outputs coupled to respective delayed digital data outputs (labeled OUT x,1, OUT x,2, ..., OUT x,N, for x=1 to P, as explained below). Each of the P digital delay lines 710-1, 710-2, ..., 710-P receives digital data via a respective one of P incoming digital delay inputs 711-1, 711-2, ..., 711-P, which is transferred through its N successive delay units in response to a respective one of data available inputs 712-1, 712-2, ..., 712-P; for example, a digital data may be transferred to a next delay unit in response to a rising edge of a data available input. FIG. 7A further illustrates P processing units 720-1, 720-2, ..., 720-P, which may be implemented much as discussed above for the processing unit 314, with each of the P processing units 720-1, 720-2, ..., 720-P likewise configured to perform, or able to be configured to perform when operated in parallel for processing the same data stream, the same function responsive to its N digital data inputs (IN x,1 to IN x,N, for a processing unit assigned to row x, as explained below) to generate a respective digital data output 721-1, 721-2, ..., 721-P based on its N digital data inputs. It is noted that P may be 1 or more (although P cannot be greater than N) and that N may be 2 or more, notwithstanding the number of features depicted in FIG. 7A.

For the purpose of this description, the P digital delay lines 710-1, 710-2, ..., 710-P and the P processing units 720-1, 720-2, ..., 720-P are assigned to P rows, numbered from row 1 to row P, with each of the P digital delay lines 710-1, 710-2, ..., 710-P in a unique row and each of the P processing units 720-1, 720-2, ..., 720-P in a unique row. A digital delay line and a processing unit are included in the same row if, when used according to a mode such as the first modes in FIGS. 5-6B where each of the N delayed digital data outputs of the digital delay line are coupled to the N digital data inputs of the processing unit. For example, for the data stream processing device 500 illustrated in FIG. 5, first digital delay line 510 and first processing unit 530 would be considered assigned together to a first row, and second digital delay line 520 and second processing unit 540 would be considered assigned together to a second row. The numbers for the rows (for example, row 1, row 2, ..., row P) corresponds to an order in which a series of P new digital data provided in parallel from a single data stream were originally presented in the single data stream, when all of the P processing units are used in parallel to process digital data from the single data stream. Row P receives the earliest or first digital data in the series, row P−1 the digital data immediately after the one for row P, and so on, such that row 1 receives the most recent or last digital data in the series. For example, if P=3, and a data stream presented a series of digital data in the order x[0], x[1], x[2], row 1 would receive x[2], row 2 would receive x[1], and row 3 would receive x[0]. It is noted that the assignment of the P digital delay lines 710-1, 710-2, ..., 710-P and the P processing units 720-1, 720-2, ..., 720-P to rows is not necessarily reflected in their physical positions in a device.

For purposes of this description, the N delayed digital data outputs included in each of the P digital delay lines 710-1, 710-2, ..., 710-P are assigned to N columns, numbered from column 1 to column N, in the order that its respective delay unit (the delay unit having an output coupled to the delayed digital data output) occurs in the succession of N successive delay units. For each of the P digital delay lines 710-1, 710-2, ..., 710-P, each of its N delayed digital data outputs is in a unique column. In FIG. 7A, each of these delayed digital outputs has a respective label in the format "OUT r,c", where r is the row number for the digital delay line in which the delayed digital data output is included, and c is the column number for the delayed digital data output. Also, the N digital data inputs included in each of the P processing units 720-1, 720-2, ..., 720-P are assigned to N columns. In FIG. 7A, each of these delayed digital outputs has a respective label in the format "IN r,c", where r is the row number for the processing unit in which the digital data input is included, and c is the column number for the digital data input. The digital data inputs are assigned to respective columns such that when a processing unit in which a digital data input IN x,y (arranged in column y) is included (the processing unit 720-x for row x) is used according to a mode such as the first modes in FIGS. 5-6B, the digital data input IN x,y is coupled to delayed digital data output OUT x,y (which is also assigned to column y). For each of the P processing units 720-1, 720-2, ..., 720-P, each of its N digital data inputs is assigned to a unique column. It is noted that the assignment of the delayed digital data outputs OUT 1,1 to OUT P,N and the digital data inputs IN 1,1 to IN P,N to rows and/or columns is not necessarily reflected in their physical positions in a device.

To enable the P processing units 720-1, 720-2, ..., 720-P to process data from a single stream in parallel that it received in groups of P new digital data received in parallel by the P digital delay lines 710-1, 710-2, ..., 710-P, each of the digital data inputs IN 1,1 to IN P,N is coupled to an appropriate one of the delayed digital data outputs OUT 1,1 to OUT P,N. This may be a selective coupling; for example, there may be control circuitry including multiplexers that each couple one of digital data inputs IN 1,1 to IN P,N to an appropriate one of the delayed digital data outputs OUT 1,1 to OUT P,N in response to a mode selection signal, as illustrated by, for example, multiplexers 562, 563, 565, and 566 in FIG. 5. Algorithm 1 illustrates how the appropriate coupling may be determined:

Algorithm 1: Couplings for Digital Data Inputs IN 1,1 to IN P,N to Delayed Digital Data Outputs

```
# P is the number of rows (also the number of processing units being
# used in parallel)
# N is the number of digital data inputs for each processing unit
for in_row = 1 to P
   for in_col = 1 to N
      # for input IN in_row,in_col, determine values out_row and
      # out_col for the output OUT out_row,out_col to be coupled to it
      # below assumes integer division; could also use floor( )
      out_col = (in_row + in_col + 1)/P
      out_row = in_row + in_col + 2 - (out_col * P)
```

Further, when the P processing units are used in parallel, some of the delayed digital data outputs OUT 1,1 to OUT P,N will not be coupled to any of the digital data inputs IN 1,1 to OUT P,N. In some implementations, the delay units with outputs coupled to the uncoupled delayed digital data outputs may be disabled to reduce power consumption. In such implementations, the control circuitry may generate enable signals for selective enabling or disabling of delay units in response to a mode selection signal. Algorithm 2 illustrates how to determine which delay units are enabled or disabled.

Algorithm 2: Determining if Delay Unit for Delayed Digital Data Output is Enabled

```
for r = 1 to P
   for c = 1 to N
      # for output OUT r,c, determine if its respective delay unit
      # is enabled via respective signal delay_r_c_enable
      if ((c * P + r - 2) > N + P)
         delay_r_c_enable = FALSE      # not used - disable
      else
         delay_r_c_enable = TRUE       # enable
```

Figure 7B:
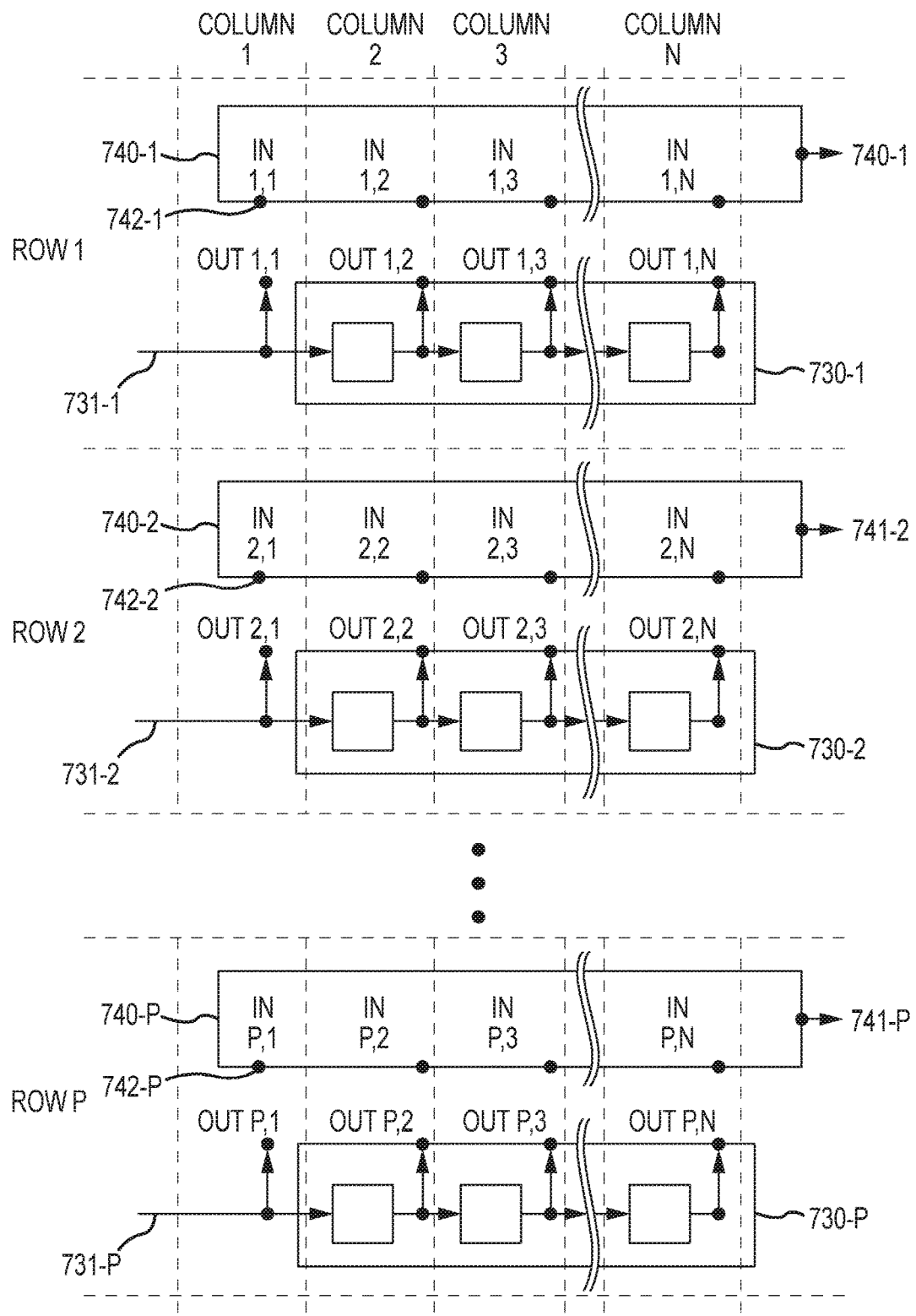
FIG. 7B illustrates use of the techniques described in connection with FIG. 7A where, as illustrated by the couplings for second processing unit in FIG. 4, the digital data outputs of the processing units are generated based on both the delayed digital data outputs from the digital delay lines and the new digital data being provided to be digital delay lines.

FIG. 7B illustrates use of the techniques described in connection with FIG. 7A where, as illustrated by the couplings for second processing unit 430 in FIG. 4, the digital data outputs of the processing units are generated based on both the delayed digital data outputs from the digital delay lines and the new digital data being provided to be digital delay lines. As illustrated in FIG. 7B, P digital delay lines 730-1, 730-2, . . . , 730-P and P processing units 740-1, 740-2, . . . , 740-P are assigned to rows, numbered from row 1 to row P, with each of the P digital delay lines 730-1, 730-2, . . . , 730-P in a unique row and each of the P processing units 740-1, 740-2, . . . , 740-P in a unique row, in much the same manner as described in connection with FIG. 7A. However, instead of N delayed digital data outputs, each of the P digital delay lines 730-1, 730-2, . . . , 730-P include N-1 successive delay units with outputs coupled to respective delayed digital data outputs (labeled OUT x,2, OUT x,3, . . . , OUT x,N, for x=1 to P). Also, the first delayed digital data output in each digital delay line, which is coupled to an output of the first delay unit in the N-1 successive delay units, is assigned to column 2, rather than column 1. None of these delayed digital data outputs are assigned to column 1. P incoming digital data inputs 731-1, 731-2, . . . , 731-P, included in and providing new digital data to respective one of the P digital delay lines 730-1, 730-2, . . . , 730-P, are each associated with column 1 and accordingly labeled OUT 1,r (with r being the number of the row of its respective digital delay line). Each of the P processing units 740-1, 740-2, . . . , 740-P includes a respective one of P digital data inputs 742-1, 742-2, . . . , 742-P used to generate, along with the digital data inputs assigned to columns 2 to N, respective one of P digital data outputs 741-1, 741-2, . . . , 741-P, and, when used according to a mode such as the first mode in FIG. 5, is coupled to the one of P incoming digital data inputs 731-1, 731-2, . . . , 731-P assigned to the same row as its processing unit. As illustrated in FIG. 7B, all of the P digital data inputs 742-1, 742-2, . . . , 742-P are assigned to column 1 (and accordingly labeled IN r,1) and all of the P incoming digital data inputs 731-1, 731-2, . . . , 731-P are also assigned to column 1 (and accordingly labeled OUT r,1). Each of the P processing units 740-1, 740-2, . . . , 740-P may be implemented much as discussed above for the processing unit 314, with each of the P processing units 740-1, 740-2, . . . , 740-P likewise configured to perform, or able to be configured to perform when operated in parallel for processing the same data stream, the same function responsive to its N digital data inputs (IN x,1 to IN x,N, for a processing unit assigned to row x) to generate its respective digital data output 741-1, 741-2, . . . , 741-P based on its N digital data inputs. Using the above approach for assigning the items labeled IN 1,1 to IN P,N and OUT 1,1 to OUT P,N to respective rows and columns, Algorithm 1 may be applied to determine for each of digital data inputs IN 1,1 to IN P,N which of one the digital data signals OUT 1,1 to OUT P,N it should be coupled to, and control circuitry may be implemented to effect those couplings, such as by use of multiplexers responsive to a mode selection signal. In some implementations, Algorithm 2 may also be applied to determine which delay units may be enabled or disabled, and control circuitry may be implemented accordingly.

The data stream processing device 500 illustrated in FIG. 5 illustrates an example consistent with the approach discussed for FIG. 7B, where P=2, N=3, and given the following row and column assignments:

Row 1 (first processing unit 530 and first digital delay line 510):
   digital data input 531=IN 1,1 x[n]=OUT 1,1
   digital data input 532=IN 1,2 output from delay unit 511=OUT 1,2
   digital data input 533=IN 1,3 output from delay unit 512=OUT 1,3
Row 2 (second processing unit 540 and second digital delay line 520):
   digital data input 541=IN 2,1 x[n-1]=OUT 2,1
   digital data input 542=IN 2,2 output from delay unit 521=OUT 2,2
   digital data input 543=IN 2,3 output from delay unit 522=OUT 2,3
Then the couplings in the second mode (M=1), as illustrated in FIG. 5, are:
   IN 1,1→OUT 1,1 IN 1,2→OUT 2,1 IN 1,3→OUT 1,2
   IN 2,1→OUT 2,1 IN 2,2→OUT 1,2 IN 2,3→OUT 2,2
Additionally, the couplings in the first mode (M=0), also illustrated in FIG. 5, are:
   IN 1,1→OUT 1,1 IN 1,2→OUT 1,2 IN 1,3→OUT 1,3
   IN 2,1→OUT 2,1 IN 2,2→OUT 2,2 IN 2,3→OUT 2,3

Control circuitry in FIG. 5 (including multiplexers 561, 562, 563, 564, 565, and 566) implements these couplings in response to the mode selection signal M.

Figure 7C:
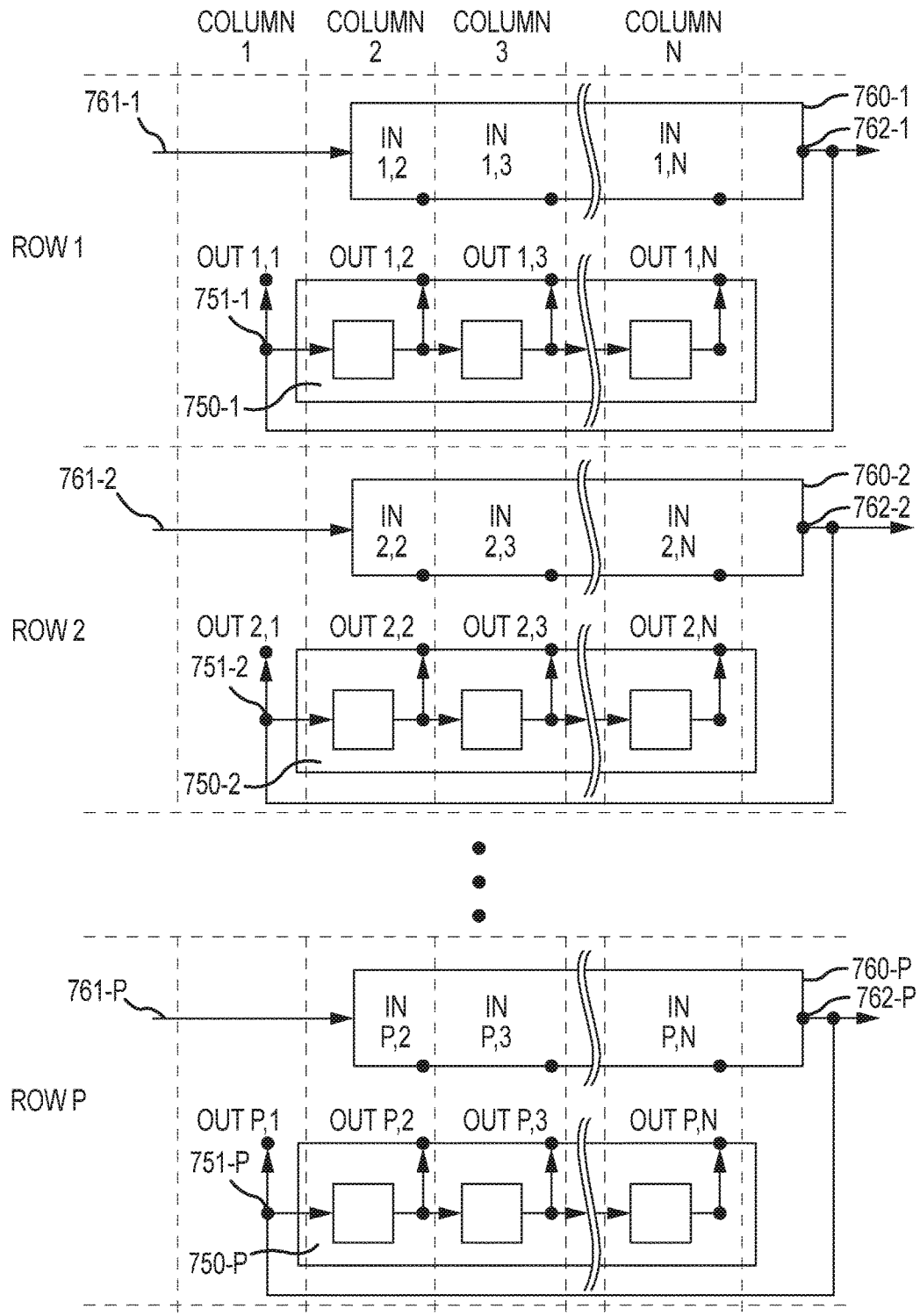
FIG. 7C illustrates use of the techniques described in connection with FIG. 7A where, as illustrated as illustrated by the couplings for first processing unit in FIG. 4, the digital delay lines instead feed back delayed digital data previously output by the processing units.

FIG. 7C illustrates use of the techniques described in connection with FIG. 7A where, as illustrated as illustrated by the couplings for first processing unit 420 in FIG. 4, the digital delay lines instead feed back delayed digital data previously output by the processing units. As illustrated in FIG. 7C, P digital delay lines 750-1, 750-2, ..., 750-P and P processing units 760-1, 760-2, ..., 760-P are assigned to rows, numbered from row 1 to row P, in the same manner described in connection with FIG. 7A. However, as in FIG. 7B, instead of N delayed digital data outputs, each of the P digital delay lines 750-1, 750-2, ..., 750-P include N−1 successive delay units with outputs coupled to respective delayed digital data outputs. (labeled OUT x,2, OUT x,3, ..., OUT x,N, for x=1 to P). These delayed digital data outputs are assigned to columns 2 to N in the same manner discussed in FIG. 7B; none of these delayed digital data outputs are assigned to column 1. Also, instead of N digital data inputs, each of the P processing units 760-1, 760-2, ..., 760-P include N−1 digital data inputs (labeled IN x,2, IN x,3, ..., IN x,N, for x=1 to P). These digital data inputs are assigned to columns 2 to N is the manner described for the digital data inputs included in the P processing units 720-1, 720-2, ..., 720-P; none of these digital data inputs are assigned to column 1. Each of the P processing units 760-1, 760-2, ..., 760-P generates a respective one of P digital data outputs 762-1, 762-2, ..., 762-P based on its N−1 digital data inputs. In some implementations, each of the P processing units 760-1, 760-2, ..., 760-P may further include a respective one of P incoming digital data inputs 761-1, 761-2, ..., 761-P, which receive groups of P new digital data for a single data stream in the same manner as the P incoming digital delay inputs 711-1, 711-2, ..., 711-P in FIG. 7A, and the respective one of P digital data outputs 760-1, 760-2, ..., 760-P is also generated based on the incoming digital data input, much as illustrated by the first processing unit 420 in FIG. 4. Each of the P processing units 760-1, 760-2, ..., 760-P may be implemented much as discussed above for the processing unit 314, with each of the P processing units 760-1, 760-2, ..., 760-P likewise configured to perform, or able to be configured to perform when operated in parallel for processing the same data stream, the same function responsive to its N−1 or N digital data inputs (IN x,2 to IN x,N, and possibly incoming digital data input 761-x, for a processing unit assigned to row x) to generate its respective digital data output 762-1, 762-2, ..., 762-P based on its N−1 or N digital data inputs. Each of the P digital delay lines 750-1, 750-2, ..., 750-P transfers digital data therethrough that is received on a respective one of P incoming digital data inputs 751-1, 751-2, ..., 711-P, which is coupled to the one of P digital data outputs 762-1, 762-2, ..., 762-P generated by the one of the P processing units 760-1, 760-2, ..., 760-P assigned to the same row. All of the P incoming digital data inputs 751-1, 751-2, ..., 711-P or all of the P digital data outputs 762-1, 762-2, ..., 762-P are assigned to column 1. Using the above approach for assigning the items labeled IN 2,1 to IN P,N and OUT 1,1 to OUT P,N to respective rows and columns, a slightly modified version of Algorithm 1 (skipping column 1, and shown below as Algorithm 3) may be applied to determine for each of digital data inputs IN 2,1 to IN P,N which of one the digital data signals OUT 1,1 to OUT P,N it should be coupled to, and control circuitry may be implemented to effect those couplings, such as by use of multiplexers responsive to a mode selection signal. In some implementations, Algorithm 2 may also be applied to determine which delay units may be enabled or disabled, and control circuitry may be implemented accordingly.

Algorithm 3: Couplings for Digital Data Inputs IN 2,1 to IN P,N to Delayed Digital Data Outputs Providing Feedback

```
# P is the number of rows (also the number of processing units being
# used in parallel)
# N is the number of digital data inputs for each processing unit
for in_row = 1 to P
    for in_col = 2 to N    # no inputs in column 1
        # for input IN in_row,in_col, determine values out_row and
        # out_col for the output OUT out_row,out_col to be coupled to it
        # below assumes integer division; could also use floor( )
        out_col = (in_row + in_col + 1)/P
        out_row = in_row + in_col + 2 − (out_col * P)
```

The feedback portion of the data stream processing device 600, illustrated in FIG. 6B, illustrates an example consistent with the approach discussed for FIG. 7C, where P=2, N=3, and given the following row and column assignments:

Row 1 (third processing unit 670 and third digital delay line 650):
    digital data output 674=OUT 1,1
    digital data input 672=IN 1,2 output from delay unit 651=OUT 1,2
    digital data input 673=IN 1,3 output from delay unit 652=OUT 1,3

Row 2 (fourth processing unit 680 and fourth digital delay line 660):
    digital data output 684=OUT 2,1
    digital data input 672=IN 2,2 output from delay unit 661=OUT 2,2
    digital data input 673=IN 2,3 output from delay unit 662=OUT 2,3

Then the couplings in the second mode (M=1), as illustrated in FIG. 6B, are:
    IN 1,2→OUT 2,1 IN 1,3→OUT 1,2
    IN 2,2→OUT 1,2 IN 2,3→OUT 2,2

Additionally, the couplings in the first mode (M=0), also illustrated in FIG. 6B, are:
    IN 1,2→OUT 1,2 IN 1,3→OUT 1,3
    IN 2,2→OUT 2,1 IN 2,3→OUT 2,3

Control circuitry in FIG. 6B (including multiplexers 693, 694, 695, and 696) implements these couplings in response to the mode selection signal M.

Figure 8A:
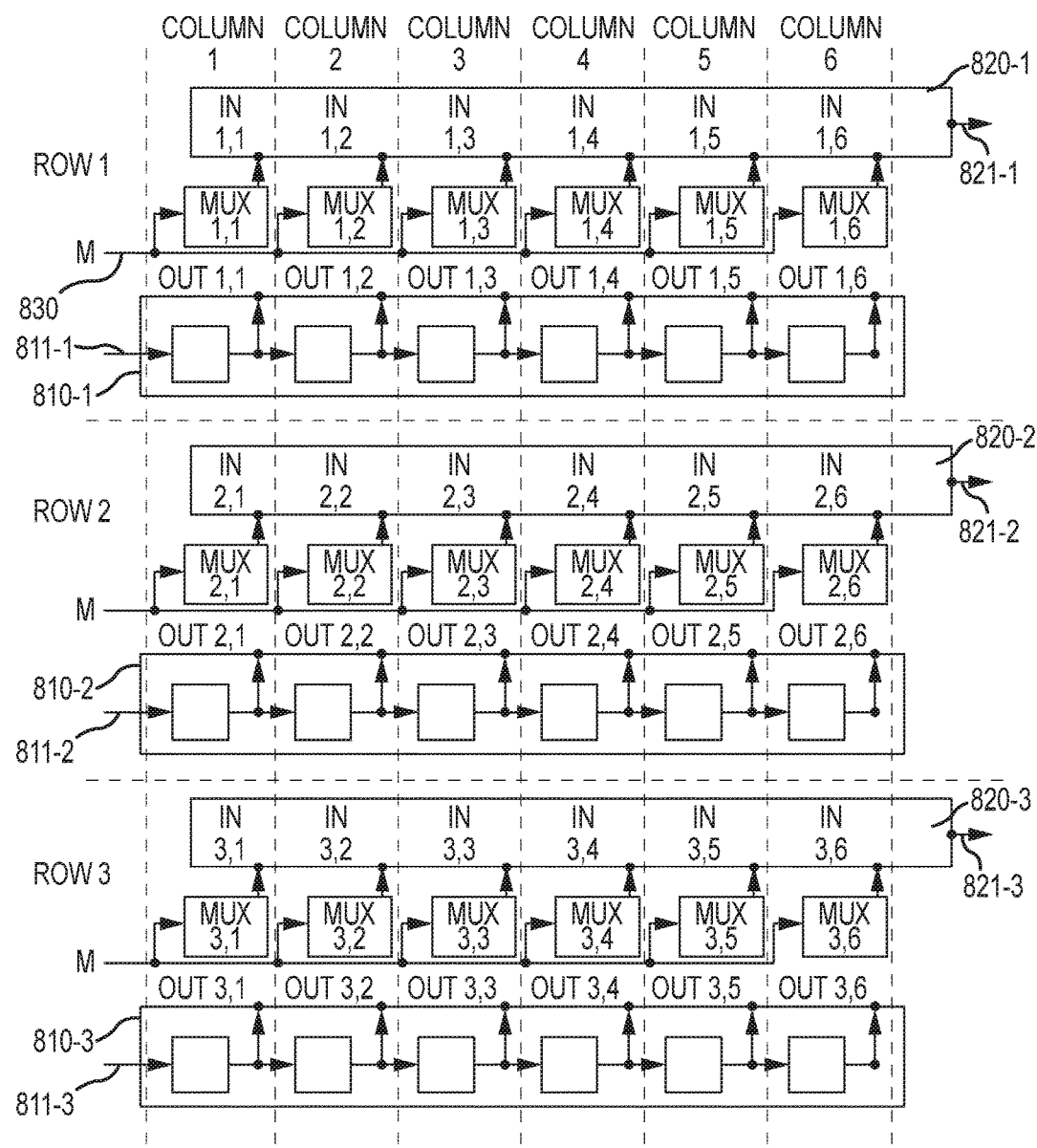
FIG. 8A illustrates an example of a data stream processing device that may be operated in a number of different modes.

FIG. 8A illustrates an example of a data stream processing device 800 that may be operated in a number of different modes. Data stream processing device 800 includes three digital delay lines 810-1, 810-2, and 810-3 each with six taps, and three processing units 820-1, 820-2, and 820-3 each generating a respective one of digital data outputs 821-1, 821-2, and 821-3 based on six digital data inputs for receiving delayed digital data. The processing units 820-1, 820-2, and 820-3 may each be implemented much as discussed above for any of the processing units 314 and 720-1, with each of the processing units 820-1, 820-2, and 820-3 likewise configured to perform, or able to be configured to perform when operated in parallel for processing the same data stream, the same function responsive to its six digital data inputs for receiving delayed digital data to generate its respective digital data output 821-1, 821-2, and 821-3 based on its six digital data inputs for receiving delayed digital data.

Figure 8B:
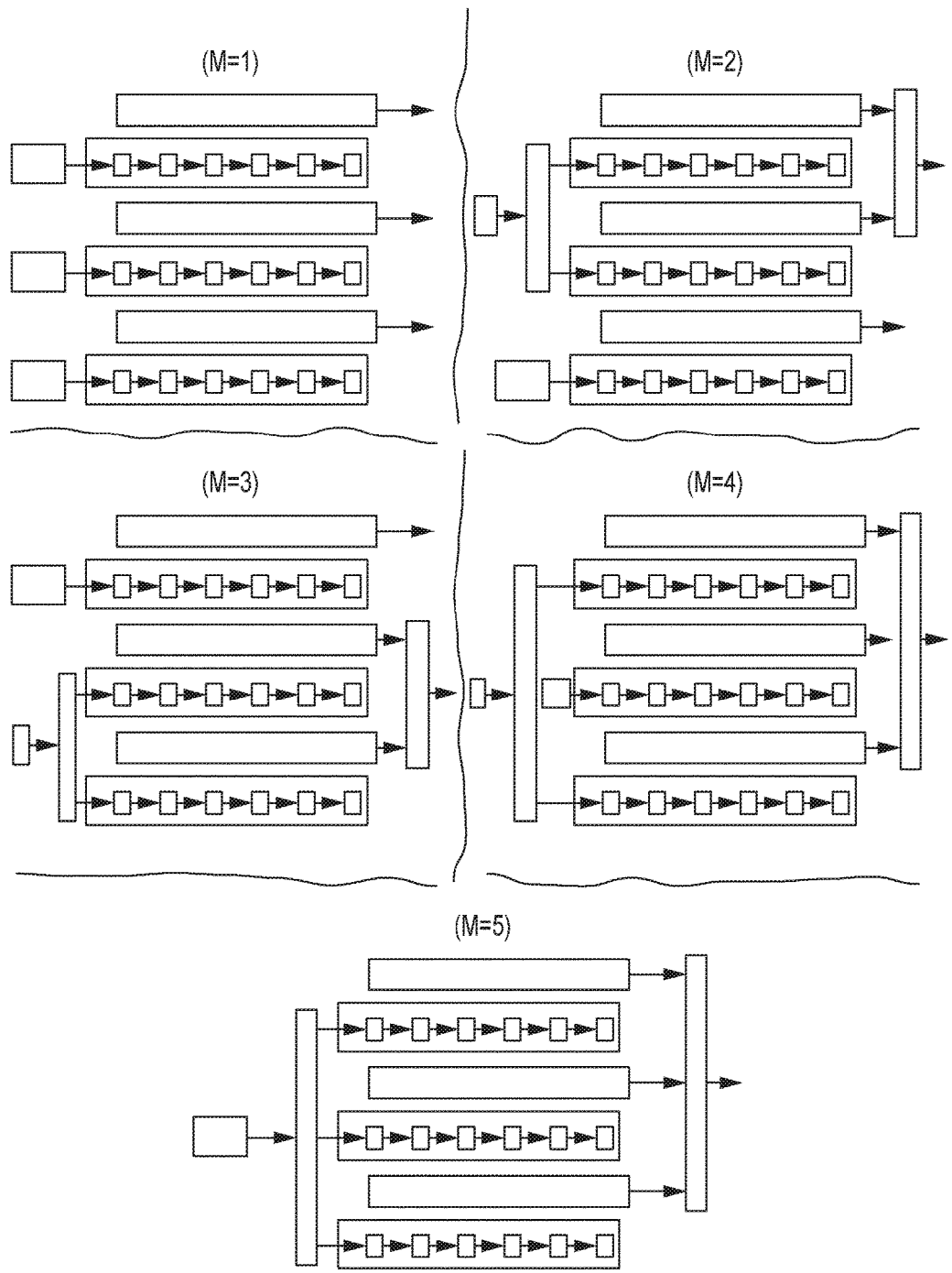
FIG. 8B illustrates five modes (M=1 to M=5) for operating the data stream processing device illustrated in FIG. 8A to process one or more data streams.
Figure 9A:
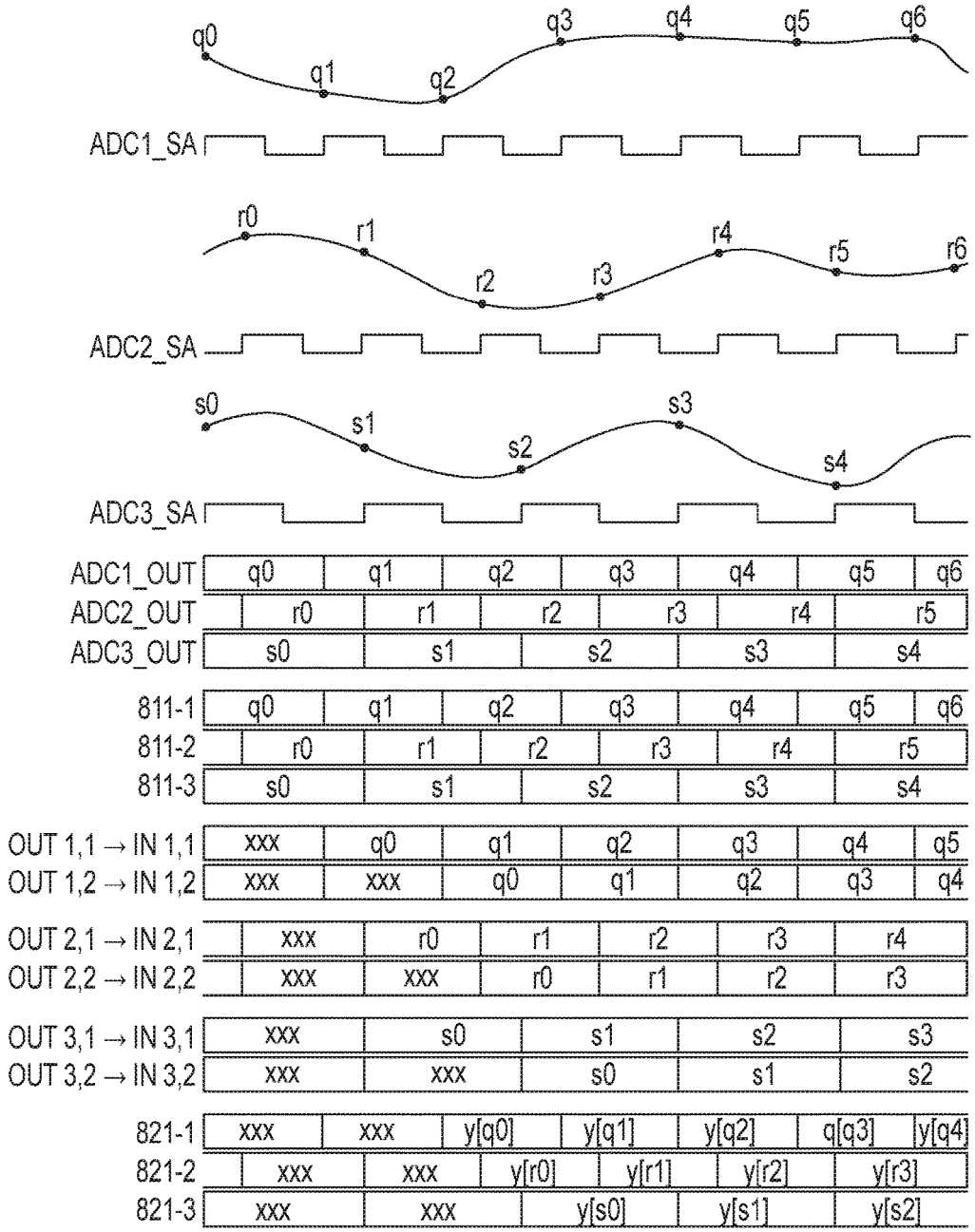
FIG. 9A illustrates an example of operation of the data stream processing device illustrated in FIG. 8A while concurrently processing digital data for three separate data streams in the first mode (M=1) illustrated in FIG. 8B.

FIG. 8B illustrates five modes (M=1 to M=5) for operating the data stream processing device 800 illustrated in FIG. 9A to process one or more data streams. A mode selection signal M is provided to a mode selection input 830 included in the data stream processing device 800. A first mode (M=1) is similar to the first modes in FIGS. 5-6B. In the first mode, each processing unit 820-1, 820-1, and 820-3 is used to process digital data for a separate data stream. Assuming each processing unit 820-1, 820-1, and 820-3 has the same minimum time $\Delta t_P$ between successive new digital data on their respective digital data outputs, similar to the amounts of time $\Delta t_P$ discussed in connection with FIGS. 3 and 7A, the three data streams can each provide digital data at a rate or frequency up to $3/\Delta t_P$.

In a second mode (M=2), processing unit 820-3 is used in the same manner as in the first mode, but processing units 820-1 and 820-2 are used in parallel to process digital data from a single data stream, much as discussed in a number of examples above. In the second mode (M=2), digital delay lines 810-1 and 810-2 receive groups of 2 new digital data in parallel, with each group including a first new digital data provided to digital delay line 810-2 that occurred in the single data stream before a second new digital data included in the group and provided to digital delay line 810-2. In a third mode (M=3), processing unit 820-1 is used in the same manner as in the first mode, but processing units 820-2 and 820-3 are used in parallel to process digital data from a single data stream, much like the parallel processing in the second mode. In the third mode (M=3), digital delay lines 810-2 and 810-3 receive groups of 2 new digital data in parallel, with each group including a first new digital data provided to digital delay line 810-3 that occurred in the single data stream before a second new digital data included in the group and provided to digital delay line 810-2. In a fourth mode (M=4), processing unit 820-2 is used in the same manner as in the first mode, but processing units 820-1 and 820-3 are used in parallel to process digital data from a single data stream, much like the parallel processing in the second and third modes. In the fourth mode (M=4), digital delay lines 810-1 and 810-3 receive groups of 2 new digital data in parallel, with each group including a first new digital data provided to digital delay line 810-3 that occurred in the single data stream before a second new digital data included in the group and provided to digital delay line 810-1. Where a data stream is being processed by two of the processing units in parallel in the second, third, or fourth modes, the data stream can provide digital data at a rate or frequency up to $2/\Delta t_P$.

In a fifth mode (M=5), all three processing units 820-1, 820-2, and 820-3 are used in parallel to process digital data from a single data stream, much as discussed previously. In the third mode (M=3), digital delay lines 810-1, 810-2, and 810-3 receive groups of 3 new digital data in parallel, with each group including first, second, and third new digital data occurring in that order in the single data stream, with the first new digital data provided to digital delay line 810-3, the second new digital data provided to digital delay line 810-2, and the third new digital data provided to digital delay line 810-1. Where a data stream is being processed by all three of the processing units in parallel in the fifth mode, the data stream can provide digital data at a rate or frequency up to $3/\Delta t_P$.

FIG. 8A illustrates digital data inputs IN 1,1 to IN 3,6 and delayed digital data outputs OUT 1,1 to OUT 3,6 assigned to rows 1 to 3 and columns 1 to 6 in accordance with the data stream processing device 800 being operated in the fifth mode (M=5) in FIG. 8B. The digital data inputs of the processing units 820-1, 820-2, and 820-3 (labeled IN 1,1 to IN 3,6) have been assigned to rows 1-3 and columns 1-6 as discussed in connection with FIG. 7A. The delayed digital data outputs of the processing units 820-1, 820-2, and 820-3 (labeled OUT 1,1 to OUT 3,6) have been assigned to rows 1-3 and columns 1-6 as discussed in connection with FIG. 8A. Additionally, FIG. 8A illustrates a portion of control circuitry that, in response to the mode selection signal, selectively couples each of the digital data inputs IN 1,1 to IN 3,6 to one of the delayed digital data outputs OUT 1,1 to OUT 3,6. In the example illustrated in FIG. 8A, each of the digital data inputs IN 1,1 to IN 3,6 is coupled to a respective one of multiplexers MUX 1,1 to MUX 3,6. Additional control circuitry may be added to appropriately generate and/or couple various signals, including, but not limited to, input digital data, data available signals, intermediate digital data, and output digital data in response to the mode selection signal M, as illustrated by the examples in FIGS. 5-6B.

FIG. 8C illustrates the selective couplings performed by each of the multiplexers MUX 1,1 to MUX 3,6 in response to the mode selection signal M for each of the five modes illustrated in FIG. 8B. As noted above, each of the multiplexers MUX 1,1 to MUX 3,6 is coupled to a respective one of digital data inputs IN 1,1 to IN 3,6, and selectively couples this digital data input to one of delayed digital data outputs OUT 1,1 to OUT 3,6 in response to the mode selection signal M. For example, via multiplexer MUX 2,4; when M=1, IN 2,4 is coupled to OUT 2,4; when M=2, IN 2,4 is coupled to OUT 1,3; when M=3, IN 2,4 is coupled to OUT 3,2; when M=4, IN 2,4 is coupled to OUT 2,4; and when M=5, IN 2,4 is coupled to OUT 2,2. The appropriate couplings may be determined by applying Algorithm 1. For example, for the first mode (M=1) the couplings for IN 1,1 to IN 1,6 may be determined using Algorithm 1 with P=1 and N=6, the couplings for IN 2,1 to IN 2,6 may be determined using Algorithm 1 with P=1 and N=6 and replacing the resulting row numbers (out_row in Algorithm 1) with 2, and the couplings for IN 3,1 to IN 3,6 may be determined using Algorithm 1 with P=1 and N=6 and replacing the resulting row numbers with 3. For the second mode (M=2) the couplings for IN 1,1 to IN 1,6 and the couplings for IN 2,1 to IN 2,6 may be determined using Algorithm 1 with P=2 and N=6, and the couplings for IN 3,1 to 3,6 are the same as when M=1. For the third mode (M=3), the couplings for IN 2,1 to IN 2,6 and the couplings for IN 3,1 to IN 3,6 may be determined using Algorithm 1 with P=2 and N=6 and increasing the resulting row numbers (out_row in Algorithm 1) by 1, and the couplings for IN 1,1 to 1,6 are the same as when M=1. For the fourth mode (M=4), the couplings for IN 1,1 to IN 1,6 and the couplings for IN 3,1 to IN 3,6 may be determined using Algorithm 1 with P=2 and N=6 and replacing resulting row numbers (out_row in Algorithm 1) of 2 with 3, and the couplings for IN 2,1 to 2,6 are the same as when M=1. For the fifth mode (M=5), the couplings for IN 1,1 to IN 3,6 may be determined using Algorithm 1 with P=3 and N=6. In some implementations, where a digital data input IN a,b is coupled to the same delayed digital data output OUT c,d for all of the modes, the multiplexer MUX a,b may be replaced by a direct coupling between IN a,b and OUT c,d; for example, in the data stream processing device 800, multiplexers MUX 1,1, MUX 2,1, and MUX 3,1 could be so replaced.

FIG. 9A illustrates an example of operation of the data stream processing device 800 illustrated in FIG. 8A while concurrently processing digital data for three separate data streams in the first mode (M=1) illustrated in FIG. 8B. In this example, the three data streams are provided by three ADCs (analog to digital converters): a first ADC (ADC1) that receives a first analog signal, samples the first signal at a first sampling rate, and outputs its samples as digital data ADC1_OUT, with a respective data available signal ADC1_SA indicating when a new sample is available on ADC1_OUT; a second ADC (ADC2) that receives a second analog signal, samples the second signal at a second sampling rate approximately the same as the first sampling rate, and outputs its samples as digital data ADC2_OUT, with a respective data available signal ADC2_SA indicating when a new sample is available on ADC2_OUT; and a third ADC (ADC3) that receives a third analog signal, samples the third signal at a third sampling rate that is lower than the first sampling rate, and outputs its samples as digital data ADC3_OUT, with a respective data available signal ADC3_SA indicating when a new sample is available on ADC3_OUT. In this example, ADC1_OUT is coupled to incoming digital data input 811-1 of digital delay line 810-1, which transfers digital data from ADC1_OUT therethrough in response to ADC1_SA; ADC2_OUT is coupled to incoming digital data input 811-2 of digital delay line 810-2, which transfers digital data from ADC2_OUT therethrough in response to ADC2_SA; and ADC3_OUT is coupled to incoming digital data input 811-3 of digital delay line 810-3, which transfers digital data from ADC3_OUT therethrough in response to ADC3_SA. The timing diagram in FIG. 9A illustrates transfer of digital data received on ADC1_OUT, ADC2_OUT, and ADC3_OUT through the first two stages of digital delay lines 810-1, 810-2, and 810-3, and generation of digital data outputs 821-1, 821-2, and 821-3 in response to the received digital data. The timings of the signals in FIG. 9A are merely illustrative, and are not intended to reflect implementation-specific timings of signals or responses to signals. For example, digital data output 821-3 might be generated more quickly in response to new delayed digital data on OUT 3,1 and OUT 3,2.

Figure 9B:
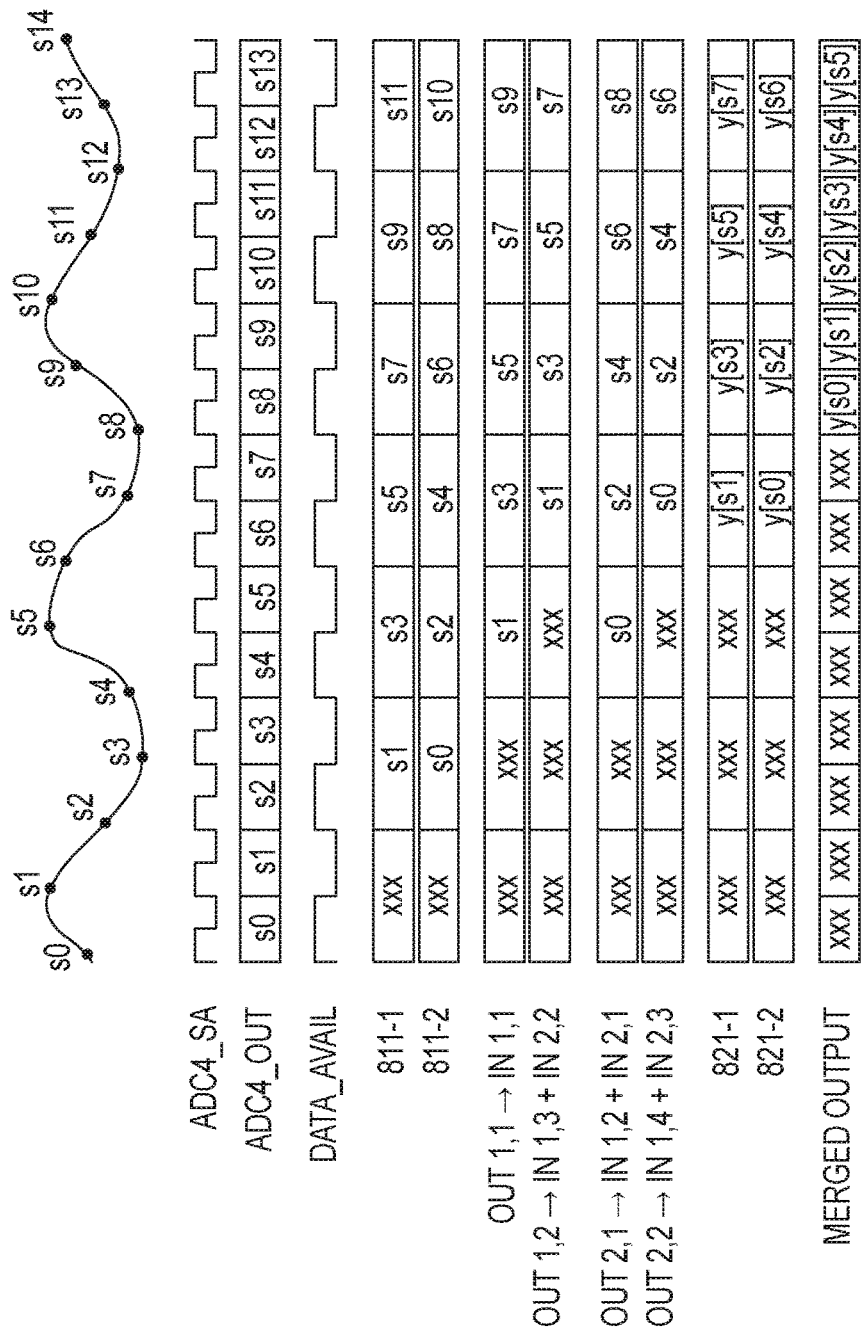
FIG. 9B illustrates an example of operation of the data stream processing device illustrated in FIG. 8A while processing digital data for a single data stream using two processing units in parallel in the second mode (M=2) illustrated in FIG. 8B.

FIG. 9B illustrates an example of operation of the data stream processing device 800 illustrated in FIG. 8A while processing digital data for a single data stream using two processing units in parallel in the second mode (M=2) illustrated in FIG. 8B. Concurrent processing of digital data by processing unit 810-3 is not illustrated in FIG. 9B. In this example, the single data stream is provided by a fourth ADC (ADC4) that receives a fourth analog signal, samples the fourth signal at a fourth sampling rate, and outputs its samples as digital data ADC4_OUT, with a respective data available signal ADC4_SA indicating when a new sample is available on ADC4_OUT. Digital data from ADC4_OUT is provided in groups of two digital data in parallel to incoming digital data inputs 811-1 and 811-2 at half the rate that new digital data is provided on ADC4_OUT (half of the fourth sampling rate); the availability of each new group is indicated by data available signal DATA_AVAIL, and digital delay lines 810-1 and 810-2 both transfer the digital data received via incoming digital data inputs 811-1 and 811-2 therethrough in response to DATA_AVAIL. The data stream processing device 800 may include control circuitry that may buffer the groups of digital data, generate DATA_AVAIL, and appropriately couple these to digital delay lines 810-1 and 810-2 in response to the mode selection signal M. FIG. 10B also illustrates a merging or multiplexing of digital data outputs 821-1 and 821-2 to produce a merged output at the fourth sampling rate. The timing diagram in FIG. 10B illustrates transfer of digital data received on ADC4_OUT through the first two stages of digital delay lines 810-1 and 810-2, generation of digital data outputs 821-1 and 821-2 in response to the received digital data, and a resulting merged output. The timings of the signals in FIG. 9B are merely illustrative, and are not intended to reflect implementation-specific timings of signals or responses to signals. For example, digital data s0 and s1 could be presented to incoming digital data inputs 811-1 and 811-2 and a rising edge presented on DATA_AVAIL at approximately the same time that digital data s1 is presented on ADC4_OUT, and y(s0) could be presented on the merged output at approximately the same time it is presented on digital data output 821-2.

Figure 9C:
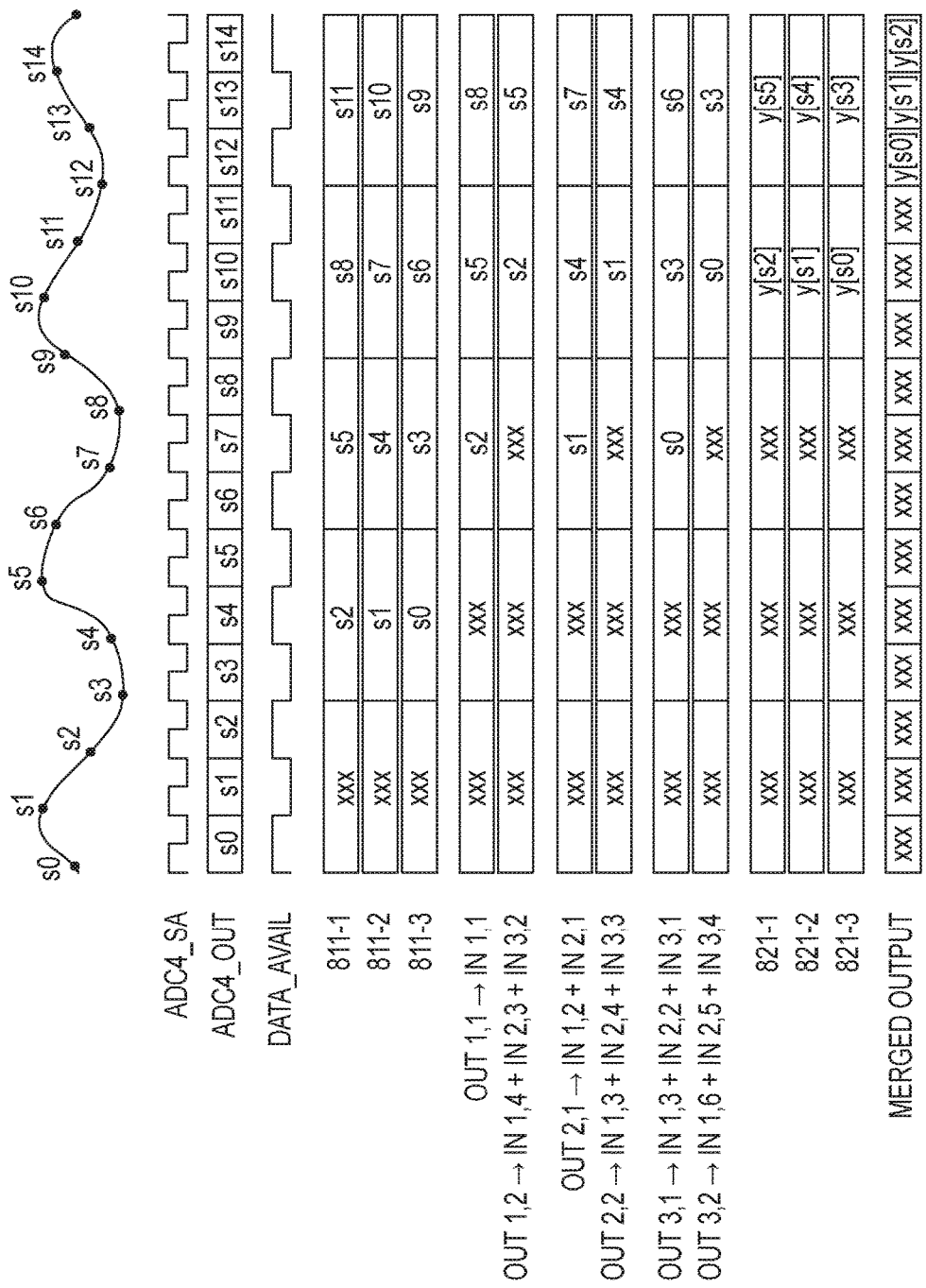
FIG. 9C illustrates an example of operation of the data stream processing device illustrated in FIG. 8A while processing digital data for a single data stream using three processing units in parallel in the fifth mode (M=5) illustrated in FIG. 8B.

FIG. 9C illustrates an example of operation of the data stream processing device 800 illustrated in FIG. 8A while processing digital data for a single data stream using three processing units in parallel in the fifth mode (M=5) illustrated in FIG. 8B. In this example, the single data stream is provided by the fourth ADC (ADC4). Digital data from ADC4_OUT is provided in groups of three digital data in parallel to incoming digital data inputs 811-1, 811-2, and 811-3 at a third of the rate that new digital data is provided on ADC4_OUT (a third of the fourth sampling rate); the availability of each new group is indicated by data available signal DATA_AVAIL, and digital delay lines 810-1, 810-2, 810-3 all transfer the digital data received via incoming digital data inputs 811-1, 811-2, and 811-3 therethrough in response to DATA_AVAIL. The data stream processing device 800 may include control circuitry that may buffer the groups of digital data, generate DATA_AVAIL, and appropriately couple these to digital delay lines 810-1, 810-2, 810-3 in response to the mode selection signal M. FIG. 9C also illustrates a merging or multiplexing of digital data outputs 821-1, 821-2, and 821-3 to produce a merged output at the fourth sampling rate. The timing diagram in FIG. 9C illustrates transfer of digital data received on ADC4_OUT through the first two stages of digital delay lines 810-1, 810-2, and 810-3, generation of digital data outputs 821-1, 821-2, and 821-3 in response to the received digital data, and a resulting merged output. The timings of the signals in FIG. 9C are merely illustrative, and are not intended to reflect implementation-specific timings of signals or responses to signals. For example, digital data s0, s1, and s2 could be presented to incoming digital data inputs 811-1, 811-2, and 811-3 and a rising edge presented on DATA_AVAIL at approximately the same time that digital data s2 is presented on ADC4_OUT, and y(s0) could be presented on the merged output at approximately the same time it is presented on digital data output 821-3.

In view of the above discussion, it should be understood how to configure similar multiplexers for control circuitry for a data stream processing device including any number X of such processing units and X digital delay lines, and using groups of selected processing units in parallel for processing a data stream. It should be understood how to configure similar multiplexers for control circuitry where the digital data outputs of the processing units are generated based on both the delayed digital data outputs from the digital delay lines and new digital data being provided to the digital delay lines, as illustrated in, and discussed in connection with, FIG. 7B. It should be understood how to configure similar multiplexers for control circuitry where the digital delay lines instead feed back delayed digital data previously output by the processing units, as illustrated in, and discussed in connection with (including Algorithm 3), FIG. 7C. Also, in view of Algorithm 2, it should be understood how to configure control circuitry for various groups of selected processing units.

In addition to having modes that control grouping of selected processing units for parallel processing of data streams, there may also be modes or submodes affecting other aspects of the processing of a data stream. For example, although a first mode may use N digital data inputs of a processing unit, and second mode may use only a portion of the same digital data inputs; this might be used to perform higher- or lower-order filtering, or to use less power between the two modes. As another example, in a first mode the received digital data may be at a first resolution (number of bits per value or sample), and in a second mode the received digital data may be at a different resolution (more or fewer bits per value or sample).

The foregoing data stream processing devices may be included in a demodulator of a communication signal receiver. For example, the demodulator may be configured to operate in a first mode in which a first data stream for a first narrowband carrier (for example, samples produced by a first ADC receiving a first signal) is processed by a first processing unit (such as any of processing units 530, 540, 630, 640, 720-1, 740-1, 760-1, and 820-1 discussed above) and a second data stream for a second narrowband carrier (for example, samples produced by a second ADC receiving a second signal) is processed by a second processing unit (different from the first processing unit), with the first and second data streams processed concurrently; and also in a second mode in which a third data stream for a wideband carrier is processed by pooling together the first and second processing units to process the third data stream in parallel. The first and second processing units may be configured to perform, for example, FIR filtering, IIR filtering, interpolation, downsampling, upsampling, or correlation. Likewise, the foregoing data stream processing devices may be included in a modular of a communication signal transmitter. Likewise, the foregoing data stream processing devices may be included in a digital filter, such as, but not limited to, in a device for audio or radar signal processing.

The foregoing data stream processing devices may be implemented in an application specific integrated circuit (ASIC). The foregoing data stream processing devices may be implemented and/or included in a field programmable gate array (FPGA) device or other such programmable hardware logic device. A bitstream may include data therein which, when received by an FPGA device or other such programmable hardware logic device, causes the receiving device to implement and/or include one or more of the foregoing data stream processing devices. A machine-readable medium may include such a bitstream recorded therein.

A machine-readable medium may include a netlist or other such hardware specification recorded thereon that when processed by suitable software and/or hardware to instantiate an ASIC device or configure an FPGA device or other such programmable hardware logic device, the device implements and/or includes one or more of the foregoing data stream processing devices. A machine-readable medium may include a device specification in a hardware description language such as, but not limited to, VHDL or Verilog, recorded thereon that when processed by suitable software and/or hardware to instantiate an ASIC device or configure an FPGA device or other such programmable hardware logic device, the device implements and/or includes one or more of the foregoing data stream processing devices. A computer-implemented method may automatically generate the foregoing netlist or other such hardware specification or device specification in a hardware description language. For example, the computer-implemented method may perform Algorithm 1 and/or Algorithm 3, or a similar algorithm, to automatically determine appropriate couplings among elements of one or more of the foregoing data stream processing devices. Instructions may be recorded on a machine-readable medium which, when executed by one or more computer processors, cause the one or more computer processors to perform the computer-implemented method.

A machine-readable medium may take many forms, including but not limited to, non-volatile media, volatile media, and transmission media. Non-volatile media includes, for example, optical disks, magnetic disks, or a flash memory device. Volatile media includes dynamic memory, such as a main memory. Transmission media includes coaxial cables, copper wire and fiber optics, including the wires that comprise a bus. Transmission media can also take the form of acoustic or light waves, such as those generated during radio-wave and infra-red data communications. All such media must be tangible to enable a bitstream, instructions, or other information carried by the media to be detected by a physical mechanism that reads the bitstream, instructions, or other information into a machine. The medium may be nontransitory.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. A data stream processing device, comprising:
a first tapped delay line which outputs data values received via a first data input on N first taps, wherein N is two or more;
a second tapped data delay line which outputs data values received via a second data input on N second taps;
a first processing unit including N first delayed data inputs and which generates a first data output based on the N first delayed data inputs;
a second processing unit including N second delayed data inputs and which generates a second data output based on the N second delayed data inputs; and
control circuitry comprising a mode selection input, and which is coupled to:
in response to the mode selection input receiving a signal indicating a first mode, simultaneously couple each of the first taps to a respective one of the first delayed data inputs and couple each of the second taps to a respective one of the second delayed data inputs, and
in response to the mode select input not receiving a signal indicating the first mode, simultaneously couple one of the first taps to one of the second delayed data inputs and couple one of the second taps to one of the first data inputs.

2. The data stream processing device of claim 1, wherein the control circuitry is coupled to, in response to the mode select input not receiving a signal indicating the first mode:
receive first and second successive data values from a data stream; and
simultaneously provide the first data value to the first data input and provide the second data value to the to the second data input.

3. The data stream processing device of claim 1, wherein the control circuitry is coupled to, in response to the mode select input not receiving a signal indicating the first mode:
receive a stream of data values at a first rate;
divide the stream of data values into successive groups of two or more data values; and
at a second rate that is slower than the first rate, for each group of data values simultaneously provide a first data value included in the group to the first data input and provide a second data value included in the group to the second data input.

4. The data stream processing device of claim 3, wherein the first processing unit is unable to correctly generate successive data values on the first data output at the first rate.

5. The data stream processing device of claim 3, further comprising:
an analog to digital converter (ADC) configured to convert an analog signal into digital data values at the first rate to generate the stream of data values.

6. The data stream processing device of claim 1, wherein
the first tapped delay line transfers data through the first taps in response to a first shift signal input;
the second tapped delay line transfers data through the second taps in response to a second shift signal input; and
the control circuitry is coupled to, in response to the mode select input not receiving a signal indicating the first mode, couple a first shift signal to both the first shift signal input and the second signal input.

7. The data stream processing device of claim 1, wherein
the first data output is coupled to the first data input;
the second data output is coupled to the second data input; and
the control circuitry is coupled to, in response to the mode select input not receiving a signal indicating the first mode, selectively couple the second data output to one of the first delayed data inputs.

8. The data stream processing device of claim 1, further comprising:
a third tapped data delay line which outputs data values received on a third data input on N third taps; and
a third processing unit including N third delayed data inputs and which generates a third data output based on the N third delayed data inputs; wherein
the control circuitry is coupled to:
in response to the mode selection input receiving a signal indicating the first mode, simultaneously couple each of the third taps to a respective one of the third delayed data inputs,
in response to the mode selection input receiving a signal indicating a second mode different from the first mode, simultaneously couple one of the first taps to one of the second delayed data inputs, couple one of the second taps to one of the first data inputs, and couple each of the third taps to a respective one of the third delayed data inputs, and
in response to the mode selection input receiving a signal not indicating the first or second modes, simultaneously couple one of the third taps to one of the first delayed data inputs and couple one of the third taps to one of the second delayed data inputs.

9. The data stream processing device of claim 1, wherein the device is implemented in any one of a field programmable gate array and an application integrated circuit.

10. A communication signal receiver comprising the data stream processing device of claim 1.

11. A method of data stream processing, the method comprising:
in response to a mode selection signal indicating a first mode, simultaneously coupling each of N first taps to a respective one of N first delayed data inputs and coupling each of N second taps to a respective one of N second delayed data inputs, wherein
the N first taps are included in a first tapped delay line which outputs data values received via a first data input on the N first taps,
the N first delayed data inputs are included in a first processing unit which generates a first data output based on the N first delayed data inputs, the N second taps are included in a second tapped delay line which outputs data values received via a second data input on the N second taps, the N second delayed data inputs are included in a second processing unit which generates a second data output based on the N second delayed data inputs, and N is two or more; and in response to the mode selection signal not indicating the first mode, simultaneously coupling one of the first taps to one of the second delayed data inputs and coupling one of the second taps to one of the first data inputs.

12. The method of claim 11, further comprising:
receiving first and second successive data values from a data stream in response to the mode selection signal not indicating the first mode, simultaneously providing the first data value to the first data input and providing the second data value to the to the second data input.

13. The method of claim 11, further comprising:
receiving a stream of data values at a first rate;

in response to the mode selection signal not indicating the first mode, dividing the stream of data values into successive groups of two or more data values; and in response to the mode selection signal not indicating the first mode, at a second rate that is slower than the first rate, for each group of data values simultaneously providing a first data value included in the group to the first data input and providing a second data value included in the group to the second data input.

14. The method of claim 13, wherein the first processing unit is unable to correctly generate successive data values on the first data output at the first rate.

15. The method of claim 13, further comprising:
converting an analog signal into digital data values at the first rate to generate the stream of data values.

16. The method of claim 11, further comprising:
transferring data through the first taps of the first tapped delay line in response to a first shift signal input;

transferring data through the second taps of the second tapped delay line in response to a second shift signal input; and in response to the mode selection signal not indicating the first mode, coupling a first shift signal to both the first shift signal input and the second signal input.

17. The method of claim 11, wherein:
the first data output is coupled to the first data input;
the second data output is coupled to the second data input; and the method further comprising, in response to the mode selection signal not indicating the first mode, selectively coupling the second data output to one of the first delayed data inputs.

18. The method of claim 11, further comprising:
in response to the mode selection signal indicating the first mode, simultaneously coupling each of N third taps to a respective one of N third delayed data inputs, wherein the N third taps are included in a third tapped delay line which outputs data values received via a third data input on the N third taps, and the N third delayed data inputs are included in a third processing unit which generates a third data output based on the N third delayed data inputs;

in response to the mode selection signal indicating a second mode different from the first mode, simultaneously coupling one of the first taps to one of the second delayed data inputs, coupling one of the second taps to one of the first data inputs, and coupling each of the third taps to a respective one of the third delayed data inputs; and in response to the mode selection signal not indicating the first or second modes, simultaneously coupling one of the third taps to one of the first delayed data inputs and coupling one of the third taps to one of the second delayed data inputs.

* * * * *